(12) United States Patent
Nardi et al.

(10) Patent No.: US 11,361,829 B2
(45) Date of Patent: Jun. 14, 2022

(54) IN-STORAGE LOGIC FOR HARDWARE ACCELERATORS

(71) Applicant: SANDISK TECHNOLOGIES LLC, Addison, TX (US)

(72) Inventors: Federico Nardi, San Jose, CA (US); Won Ho Choi, San Jose, CA (US)

(73) Assignee: SanDisk Technologies LLC, Addison, TX (US)

( * ) Notice: Subject to any disclaimer, the term of this patent is extended or adjusted under 35 U.S.C. 154(b) by 326 days.

(21) Appl. No.: 16/775,639

(22) Filed: Jan. 29, 2020

(65) Prior Publication Data
US 2021/0233592 A1 Jul. 29, 2021

(51) Int. Cl.
| G11C 16/04 | (2006.01) |
| G11C 16/26 | (2006.01) |
| H01L 27/11565 | (2017.01) |
| H01L 27/11582 | (2017.01) |
| H01L 27/11519 | (2017.01) |
| H01L 27/11556 | (2017.01) |

(52) U.S. Cl.
CPC .......... *G11C 16/26* (2013.01); *G11C 16/0483* (2013.01); *H01L 27/11519* (2013.01); *H01L 27/11556* (2013.01); *H01L 27/11565* (2013.01); *H01L 27/11582* (2013.01)

(58) Field of Classification Search
CPC . G11C 16/26; G11C 16/0483; G11C 16/3468; G11C 11/5642; H01L 27/11519; H01L 27/11556; H01L 27/11565; H01L 27/11582; H01L 27/11573

USPC .................................................... 365/185.17
See application file for complete search history.

(56) References Cited

U.S. PATENT DOCUMENTS

| 6,049,899 A | * | 4/2000 | Auclair | ............ | G11C 29/50004 714/766 |
| 6,807,101 B2 | * | 10/2004 | Ooishi | ............... | G11C 16/3436 365/205 |
| 7,177,199 B2 | * | 2/2007 | Chen | .................. | G11C 16/3454 365/185.11 |
| 8,964,444 B2 | * | 2/2015 | Hall | ....................... | G11C 17/16 365/96 |

* cited by examiner

*Primary Examiner* — Tha-O H Bui
(74) *Attorney, Agent, or Firm* — Vierra Magen Marcus LLP

(57) ABSTRACT

Systems and methods for performing in-storage logic operations using one or more memory cell transistors and a programmable sense amplifier are described. The logic operations may comprise basic Boolean logic operations (e.g., OR and AND operations) or secondary Boolean logic operations (e.g., XOR and IMP operations). The one or more memory cell transistors may be used for storing user data during a first time period and then used for performing a logic operation during a second time period subsequent to the first time period. During the logic operation, a first memory cell transistor of the one or more memory cell transistors may be programmed with a threshold voltage that corresponds with a first input operand value and then a gate voltage bias may be applied to the first memory cell transistor during the logic operation that corresponds with a second input operand value.

20 Claims, 18 Drawing Sheets

| AND Truth Table | | |
|---|---|---|
| $V_g$ | $V_T$ | $I_d$ |
| 0 | 0 | 0 |
| 0 | 1 | 0 |
| 1 | 0 | 0 |
| 1 | 1 | 1 |

XOR Truth Table

| $V_g$ | $V_T$ | $I_d$ |
|---|---|---|
| 0 | 0 | 0 |
| 0 | 1 | 1 |
| 1 | 0 | 1 |
| 1 | 1 | 0 |

IMP Truth Table

| $V_g$ | $V_T$ | $I_d$ |
|---|---|---|
| 0 | 0 | 1 |
| 0 | 1 | 1 |
| 1 | 0 | 0 |
| 1 | 1 | 1 |

IN-STORAGE LOGIC FOR HARDWARE ACCELERATORS

BACKGROUND

The strong growth in demand for portable consumer electronics is driving the need for high-capacity storage devices. Non-volatile semiconductor memory devices, such as flash memory storage cards, are widely used to meet the ever-growing demands on digital information storage and exchange. Their portability, versatility and rugged design, along with their high reliability and large capacity, have made such memory devices ideal for use in a wide variety of electronic devices, including for example digital cameras, digital music players, video game consoles, PDAs, cellular telephones and solid state drives (SSDs).

Semiconductor memory devices may comprise non-volatile memory or volatile memory. A non-volatile memory allows information to be stored and retained even when the non-volatile memory is not connected to a source of power (e.g., a battery). Examples of non-volatile memory include flash memory (e.g., NAND-type and NOR-type flash memory) and Electrically Erasable Programmable Read-Only Memory (EEPROM). Both flash memory and EEPROM typically utilize floating-gate transistors. For each floating-gate transistor, a floating gate is positioned above and insulated from a channel region of the floating-gate transistor. The channel region is positioned between source and drain regions of the floating-gate transistor. A control gate is positioned above and insulated from the floating gate. The threshold voltage of the floating-gate transistor may be controlled by setting the amount of charge stored on the floating gate. The amount of charge on the floating gate is typically controlled using Fowler-Nordheim (F-N) tunneling or hot-electron injection. The ability to adjust the threshold voltage allows a floating-gate transistor to act as a non-volatile storage element or memory cell. In some cases, more than one data bit per memory cell (i.e., a multi-level or multi-state memory cell) may be provided by programming and reading multiple threshold voltages or threshold voltage ranges.

BRIEF DESCRIPTION OF THE DRAWINGS

Like-numbered elements refer to common components in the different figures.

DETAILED DESCRIPTION

Figure 1:
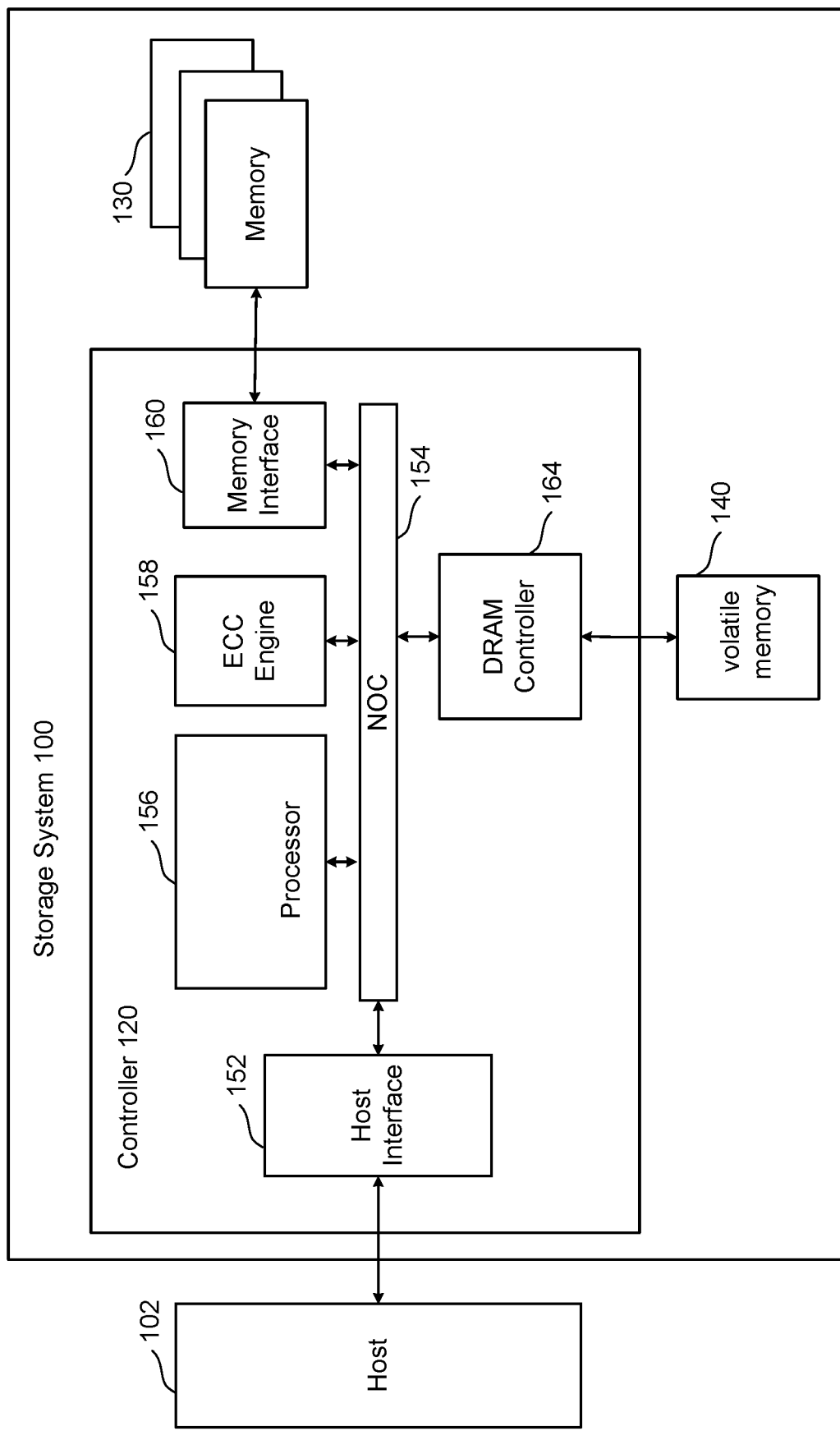
FIG. 1 is a block diagram depicting one embodiment of a memory system.

Technology is described for performing in-storage logic operations using one or more memory cell transistors, such as floating gate transistors or charge trap transistors, and a programmable sense amplifier. The logic operations may comprise basic Boolean logic operations (e.g., NOT, OR, and AND operations) or secondary Boolean logic operations (e.g., NOR, NAND, XOR, XNOR, IMP, NIMP, RIMP, and NRIMP operations) that are performed using the one or more memory cell transistors in communication with the programmable sense amplifier that detects or compares a memory cell current flowing through the one or more memory cell transistors during the logic operations. The secondary Boolean logic operations may be directly implemented using the one or more memory cell transistors or may be derived from a combination of the basic Boolean logic operations. The one or more memory cell transistors may be used for storing user data during a first time period and then used for performing a logic operation during a second time period subsequent to the first time period. During a logic operation, a first memory cell transistor of the one or more memory cell transistors may be programmed with a threshold voltage that corresponds with a first input operand value and then a gate voltage bias may be applied to the first memory cell transistor during the logic operation that corresponds with a second input operand value. The settings for the threshold voltage and the gate voltage applied to the first memory cell transistor during the logic operation may be acquired from a lookup table based on the type of logic operation to be performed during the logic operation (e.g., an OR logic operation).

The programmable sense amplifier may compare a memory cell current flowing through the one or more memory cell transistors with a programmable threshold current in order to determine whether the memory cell current is greater than the programmable threshold current. In some cases, the programmable sense amplifier may compare the memory cell current flowing through the one or more memory cell transistors with two different programmable threshold currents in order to determine whether the memory cell current is between the two different programmable threshold currents, is greater than both of the two different programmable threshold currents, or is less than both of the two different programmable threshold currents. In one example, if the memory cell current is between the two different programmable threshold currents (e.g., is between 1 uA and 10 uA), then the programmable sense amplifier may output a first data value (e.g., a "0"); however, if the memory cell current is not between the two different programmable threshold currents, then the programmable sense amplifier may output a second data value (e.g., a "1") that is different from the first data value. The memory cell current may not be a current value that is between the two different programmable threshold currents if the memory cell current is greater than both of the two different programmable threshold currents or is less than both of the two different programmable threshold currents.

In some embodiments, data values or operands for a logic operation to be performed may be stored using a hardware accelerator that is connected to a CPU (e.g., via a Compute Express Link). The hardware accelerator may include a memory array with one or more memory cell transistors. The memory array may include strings of memory cell transistors (e.g., vertical NAND strings). The memory cell transistors may comprise floating gate transistors or charge trap transistors. The hardware accelerator may pre-fetch the data values or operands and subsequently perform the logic operation using the memory cell transistors and a programmable sense amplifier. One technical benefit of using the hardware accelerator to store the operands and perform the logic operation is that data movement may be minimized as both the data storage and the logic operation are performed using the hardware accelerator. Another technical benefit of using the hardware accelerator is that die area may be reduced as only one memory cell transistor may be required for performing the logic operation compared with multiple transistors for a typical standard CMOS implementation.

In some embodiments, a hardware accelerator that includes a memory array with memory cell transistors and a programmable sense amplifier may preset or preprogram threshold voltages of memory cell transistors based on operands stored within the hardware accelerator. In one example, if one of the operands for a logic operation is stored within the hardware accelerator, then the threshold voltage for a first memory cell transistor may be programmed based on the stored operand. One technical benefit of presetting the threshold voltage for the first memory cell transistor is that the time to perform the subsequent logic operation may be reduced as the step of setting the threshold voltage for the first memory cell transistor may be skipped and the time to perform the logic operation may be dictated by the time to bias the gate voltage of the first memory cell transistor and sense the memory cell current through the first memory cell transistor.

In one embodiment, a non-volatile storage system may include one or more two-dimensional arrays of non-volatile memory cells. The memory cells within a two-dimensional memory array may form a single layer of memory cells and may be selected via control lines (e.g., word lines and bit lines) in the X and Y directions. In another embodiment, a non-volatile storage system may include one or more monolithic three-dimensional memory arrays in which two or more layers of memory cells may be formed above a single substrate without any intervening substrates. In some cases, a three-dimensional memory array may include one or more vertical columns of memory cells located above and orthogonal to a substrate or substantially orthogonal to the substrate (e.g., within 2-5 degrees of a normal vector that is orthogonal to the substrate). In one example, a non-volatile storage system may include a memory array with vertical bit lines or bit lines that are arranged orthogonal to a semiconductor substrate. The substrate may comprise a silicon substrate. The memory array may comprise various memory structures including planar NAND structures, vertical NAND structures, Bit Cost Scalable (BiCS) NAND structures, 3D NAND structures, or 3D ReRAM structures.

FIG. 1 is a block diagram of one embodiment of a memory system 100 that implements the proposed technology, including countermeasures for avoiding unrecoverable errors due to over programming. In one embodiment, storage system 100 is a solid state drive ("SSD"). Memory system 100 can also be a memory card, USB drive or other type of storage system. The proposed technology is not limited to any one type of memory system. Memory system 100 is connected to host 102, which can be a computer, server, electronic device (e.g., smart phone, tablet or other mobile device), appliance, or another apparatus that uses memory and has data processing capabilities. In some embodiments, host 102 is separate from, but connected to, memory system 100. In other embodiments, memory system 100 is embedded within host 102.

The components of memory system 100 depicted in FIG. 1 are electrical circuits. Memory system 100 includes a controller 120 connected to one or more memory die 130 and local high speed volatile memory 140 (e.g., DRAM). The one or more memory die 130 each comprise a plurality of non-volatile memory cells. More information about the structure of each memory die 130 is provided below. Local high speed volatile memory 140 is used by controller 120 to perform certain functions. For example, local high speed volatile memory 140 stores logical to physical address translation tables ("L2P tables").

Controller 120 comprises a host interface 152 that is connected to and in communication with host 102. In one embodiment, host interface 152 provides a PCIe interface. Other interfaces can also be used, such as SCSI, SATA, etc. Host interface 152 is also connected to a network-on-chip (NOC) 154. A NOC is a communication subsystem on an integrated circuit. NOC's can span synchronous and asynchronous clock domains or use unclocked asynchronous logic. NOC technology applies networking theory and methods to on-chip communications and brings notable improvements over conventional bus and crossbar interconnections. NOC improves the scalability of systems on a chip (SoC) and the power efficiency of complex SoCs compared to other designs. The wires and the links of the NOC are shared by many signals. A high level of parallelism is achieved because all links in the NOC can operate simultaneously on different data packets. Therefore, as the complexity of integrated subsystems keep growing, a NOC provides enhanced performance (such as throughput) and scalability in comparison with previous communication architectures (e.g., dedicated point-to-point signal wires, shared buses, or segmented buses with bridges). In other embodiments, NOC 154 can be replaced by a bus. Connected to and in communication with NOC 154 is processor 156, ECC engine 158, memory interface 160, and DRAM controller 164. DRAM controller 164 is used to operate and communicate with local high speed volatile memory 140 (e.g., DRAM). In other embodiments, local high speed volatile memory 140 can be SRAM or another type of volatile memory.

ECC engine 158 performs error correction services. For example, ECC engine 158 performs data encoding and decoding, as per the implemented ECC technique. In one embodiment, ECC engine 158 is an electrical circuit programmed by software. For example, ECC engine 158 can be a processor that can be programmed. In other embodiments, ECC engine 158 is a custom and dedicated hardware circuit without any software. In another embodiment, the function of ECC engine 158 is implemented by processor 156.

Processor 156 performs the various controller memory operations, such as programming, erasing, reading, as well as memory management processes. In one embodiment, processor 156 is programmed by firmware. In other embodiments, processor 156 is a custom and dedicated hardware circuit without any software. Processor 156 also implements a translation module, as a software/firmware process or as a dedicated hardware circuit. In many systems, the non-volatile memory is addressed internally to the storage system using physical addresses associated with the one or more memory die. However, the host system will use logical addresses to address the various memory locations. This enables the host to assign data to consecutive logical addresses, while the storage system is free to store the data as it wishes among the locations of the one or more memory die. To implement this system, the controller (e.g., the translation module) performs address translation between the logical addresses used by the host and the physical addresses used by the memory dies. One example implementation is to maintain tables (i.e. the L2P tables mentioned above) that identify the current translation between logical addresses and physical addresses. An entry in the L2P table may include an identification of a logical address and corresponding physical address. Although logical address to physical address tables (or L2P tables) include the word "tables" they need not literally be tables. Rather, the logical address to physical address tables (or L2P tables) can be any type of data structure. In some examples, the memory space of a storage system is so large that the local memory 140 cannot hold all of the L2P tables. In such a case, the entire set of L2P tables are stored in a memory die 130 and a subset of the L2P tables are cached (L2P cache) in the local high speed volatile memory 140.

Memory interface 160 communicates with one or more memory die 130. In one embodiment, memory interface provides a Toggle Mode interface. Other interfaces can also be used. In some example implementations, memory interface 160 (or another portion of controller 120) implements a scheduler and buffer for transmitting data to and receiving data from one or more memory die.

Figure 2:
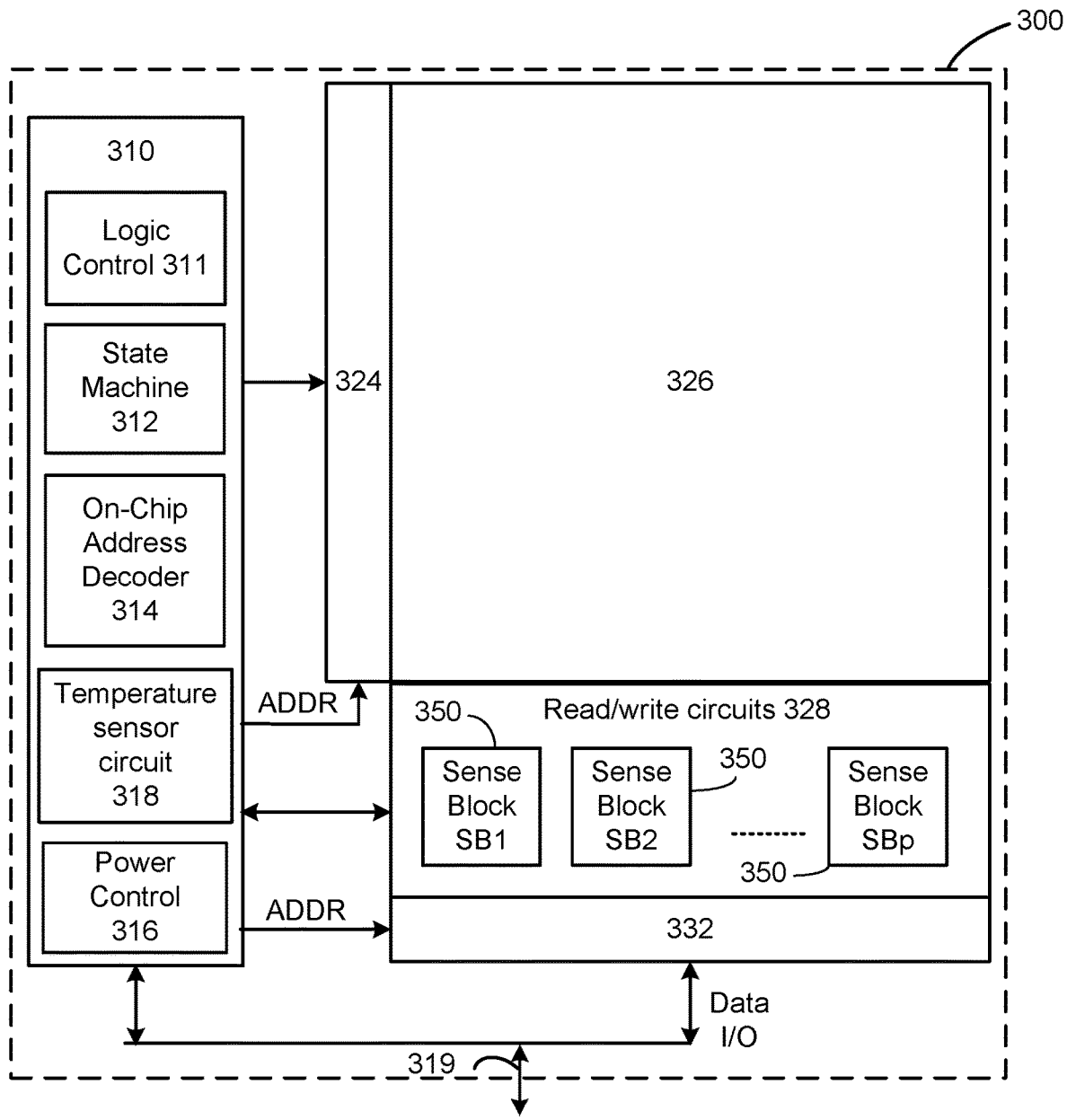
FIG. 2 is a block diagram of one embodiment of a memory die.

FIG. 2 is a functional block diagram of one embodiment of a memory die 300. Each of the one or more memory die 130 of FIG. 1 can be implemented as memory die 300 of FIG. 2. The components depicted in FIG. 2 are electrical circuits. In one embodiment, each memory die 300 includes a memory structure 326, control circuitry 310, and read/write circuits 328. Memory structure 326 is addressable by word lines via a row decoder 324 and by bit lines via a column decoder 332. The read/write circuits 328 include multiple sense blocks 350 including SB1, SB2, . . . , SBp (sensing circuitry) and allow a page (or multiple pages) of data in multiple memory cells to be read or programmed (written) in parallel. In one embodiment, each sense block include a sense amplifier and a set of latches connected to the bit line. The latches store data to be written and/or data that has been read. The sense amplifiers include bit line drivers. Commands and data are transferred between the controller and the memory die 300 via lines 319. In one embodiment, memory die 300 includes a set of input and/or output (I/O) pins that connect to lines 118.

Control circuitry 310 cooperates with the read/write circuits 328 to perform memory operations (e.g., write, read, erase, and others) on memory structure 326. In one embodiment, control circuitry 310 includes a state machine 312, an on-chip address decoder 314, a power control circuit 316 and a temperature sensor circuit 318. State machine 312 provides die-level control of memory operations. In one embodiment, state machine 312 is programmable by software. In other embodiments, state machine 312 does not use software and is completely implemented in hardware (e.g., electrical circuits). In some embodiments, state machine 312 can be replaced by a programmable microcontroller or microprocessor. In one embodiment, control circuitry 310 includes buffers such as registers, ROM fuses and other storage devices for storing default values such as base voltages and other parameters. Temperature sensor circuit 318 detects current temperature at memory die 300.

The logic control circuit 311 may include a memory buffer, state machine, and lookup tables for facilitating Boolean logic operations using one or more memory cells within the memory structure 326. The lookup tables may store threshold voltage ($V_T$) settings and selected word line or gate voltage (VG) settings corresponding with various logic operations (e.g., OR, XOR, and AND operations) to be performed using the one or more memory cells. The logic control circuit 311 may then cause the one or more memory cells (e.g., comprising floating gate or charge trap transistors) to be programmed to particular threshold voltages based on input operand values or literals and configure the current thresholds for one or more sense amplifiers in communication with the one or more memory cells, such as read/write circuits 328, based on the input operand values. A bit line decoder may electrically connect bit lines connected to the one or more memory cells to a programmable sense amplifier located within the read/write circuits 328.

In some embodiments, one or more of the components (alone or in combination) within the memory die 300 may be referred to as a managing or control circuit. For example, one or more managing or control circuits may include any one of or a combination of control circuitry 310, logic control circuit 311, state machine 312, decoder 314, power control 316, sense blocks 350, or read/write circuits 328. The one or more managing circuits or the one or more control circuits may perform or facilitate one or more memory array operations including erasing, programming, or reading operations.

The on-chip address decoder 314 provides an address interface between addresses used by controller 120 to the hardware address used by the decoders 324 and 332. Power control module 316 controls the power and voltages supplied to the word lines and bit lines during memory operations. Power control module 316 may include charge pumps for creating voltages.

For purposes of this document, control circuitry 310, read/write circuits 328 and decoders 324/332 comprise one embodiment of a control circuit for memory structure 326. In other embodiments, other circuits that support and operate on memory structure 326 can be referred to as a control circuit. For example, in some embodiments, the controller can operate as the control circuit or can be part of the control circuit. In some embodiments, the controller in combination with control circuitry 310, read/write circuits 328 and decoders 324/332 comprise one embodiment of a control circuit. In another embodiment, state machine 312 comprises the control circuit. In another embodiment, the host can provide the control circuit.

In one embodiment, memory structure 326 comprises a monolithic three dimensional memory array of non-volatile memory cells in which multiple memory levels are formed above a single substrate, such as a wafer. The memory structure may comprise any type of non-volatile memory that is monolithically formed in one or more physical levels of arrays of memory cells having an active area disposed above a silicon (or other type of) substrate. In one example, the non-volatile memory cells of memory structure 326 comprise vertical NAND strings with charge-trapping material such as described, for example, in U.S. Pat. No. 9,721,662, incorporated herein by reference in its entirety. A NAND string includes memory cells connected by a channel.

In another embodiment, memory structure 326 comprises a two dimensional memory array of non-volatile memory cells. In one example, the non-volatile memory cells are NAND flash memory cells utilizing floating gates such as described, for example, in U.S. Pat. No. 9,082,502, incorporated herein by reference in its entirety. Other types of memory cells (e.g., NOR-type flash memory) can also be used.

The exact type of memory array architecture or memory cell included in memory structure 326 is not limited to the examples above. Many different types of memory array architectures or memory cell technologies can be used to form memory structure 326. No particular non-volatile memory technology is required for purposes of the new claimed embodiments proposed herein. Other examples of suitable technologies for memory cells of the memory structure 326 include ferroelectric memories (FeRAM or FeFET), ReRAM memories, magnetoresistive memory (e.g., MRAM, Spin Transfer Torque MRAM, Spin Orbit Torque MRAM), phase change memory (e.g., PCM), and the like. Examples of suitable technologies for architectures of memory structure 326 include two dimensional arrays, three dimensional arrays, cross-point arrays, stacked two dimensional arrays, vertical bit line arrays, and the like.

One example of a ReRAM, or PCMRAM, cross point memory includes reversible resistance-switching elements arranged in cross point arrays accessed by X lines and Y lines (e.g., word lines and bit lines). In another embodiment, the memory cells may include conductive bridge memory elements. A conductive bridge memory element may also be referred to as a programmable metallization cell. A conductive bridge memory element may be used as a state change element based on the physical relocation of ions within a solid electrolyte. In some cases, a conductive bridge memory element may include two solid metal electrodes, one relatively inert (e.g., tungsten) and the other electrochemically active (e.g., silver or copper), with a thin film of the solid electrolyte between the two electrodes. As temperature increases, the mobility of the ions also increases causing the programming threshold for the conductive bridge memory cell to decrease. Thus, the conductive bridge memory element may have a wide range of programming thresholds over temperature.

Magnetoresistive memory (MRAM) stores data by magnetic storage elements. The elements are formed from two ferromagnetic plates, each of which can hold a magnetization, separated by a thin insulating layer. One of the two plates is a permanent magnet set to a particular polarity; the other plate's magnetization can be changed to match that of an external field to store memory. A memory device is built from a grid of such memory cells. In one embodiment for programming, each memory cell lies between a pair of write lines arranged at right angles to each other, parallel to the cell, one above and one below the cell. When current is passed through them, an induced magnetic field is created.

Phase change memory (PCM) exploits the unique behavior of chalcogenide glass. One embodiment uses a Ge2Sb2Te5 alloy to achieve phase changes by electrically heating the phase change material. The doses of programming are electrical pulses of different amplitude and/or length resulting in different resistance values of the phase change material.

A person of ordinary skill in the art will recognize that the technology described herein is not limited to a single specific memory structure, but covers many relevant memory structures within the spirit and scope of the technology as described herein and as understood by one of ordinary skill in the art.

Figure 3:
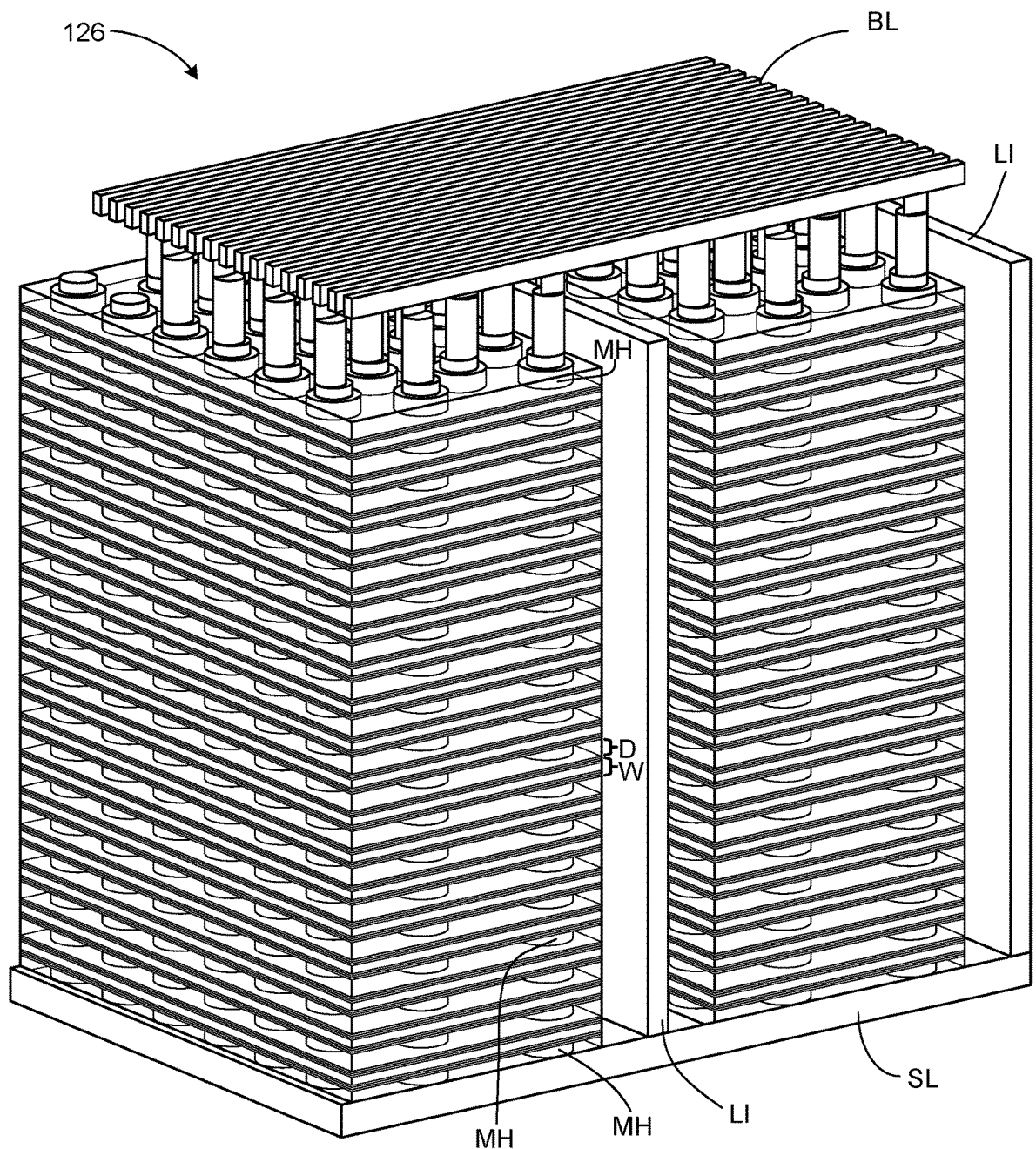
FIG. 3 is a perspective view of a portion of one embodiment of a monolithic three dimensional memory structure.

FIG. 3 is a perspective view of a portion of one example embodiment of a monolithic three dimensional memory array that can comprise memory structure 326, which includes a plurality non-volatile memory cells arranged as vertical NAND strings. For example, FIG. 3 shows a portion of one block of memory. The structure depicted includes a set of bit lines BL positioned above a stack of alternating dielectric layers and conductive layers. For example purposes, one of the dielectric layers is marked as D and one of the conductive layers (also called word line layers) is marked as W. The number of alternating dielectric layers and conductive layers can vary based on specific implementation requirements. One set of embodiments includes between 108-300 alternating dielectric layers and conductive layers. One example embodiment includes 96 data word line layers, 8 select layers, 6 dummy word line layers and 110 dielectric layers. More or less than 108-300 layers can also be used. As will be explained below, the alternating dielectric layers and conductive layers are divided into four "fingers" by local interconnects LI. FIG. 3 shows two fingers and two local interconnects LI. Below the alternating dielectric layers and word line layers is a source line layer SL. Memory holes are formed in the stack of alternating dielectric layers and conductive layers. For example, one of the memory holes is marked as MH. Note that in FIG. 3, the dielectric layers are depicted as see-through so that the reader can see the memory holes positioned in the stack of alternating dielectric layers and conductive layers. In one embodiment, NAND strings are formed by filling the memory hole with materials including a charge-trapping material to create a vertical column of memory cells. Each memory cell can store one or more bits of data. More details of the three dimensional monolithic memory array that comprises memory structure 126 is provided below with respect to FIG. 4A-4F.

Figure 4A:
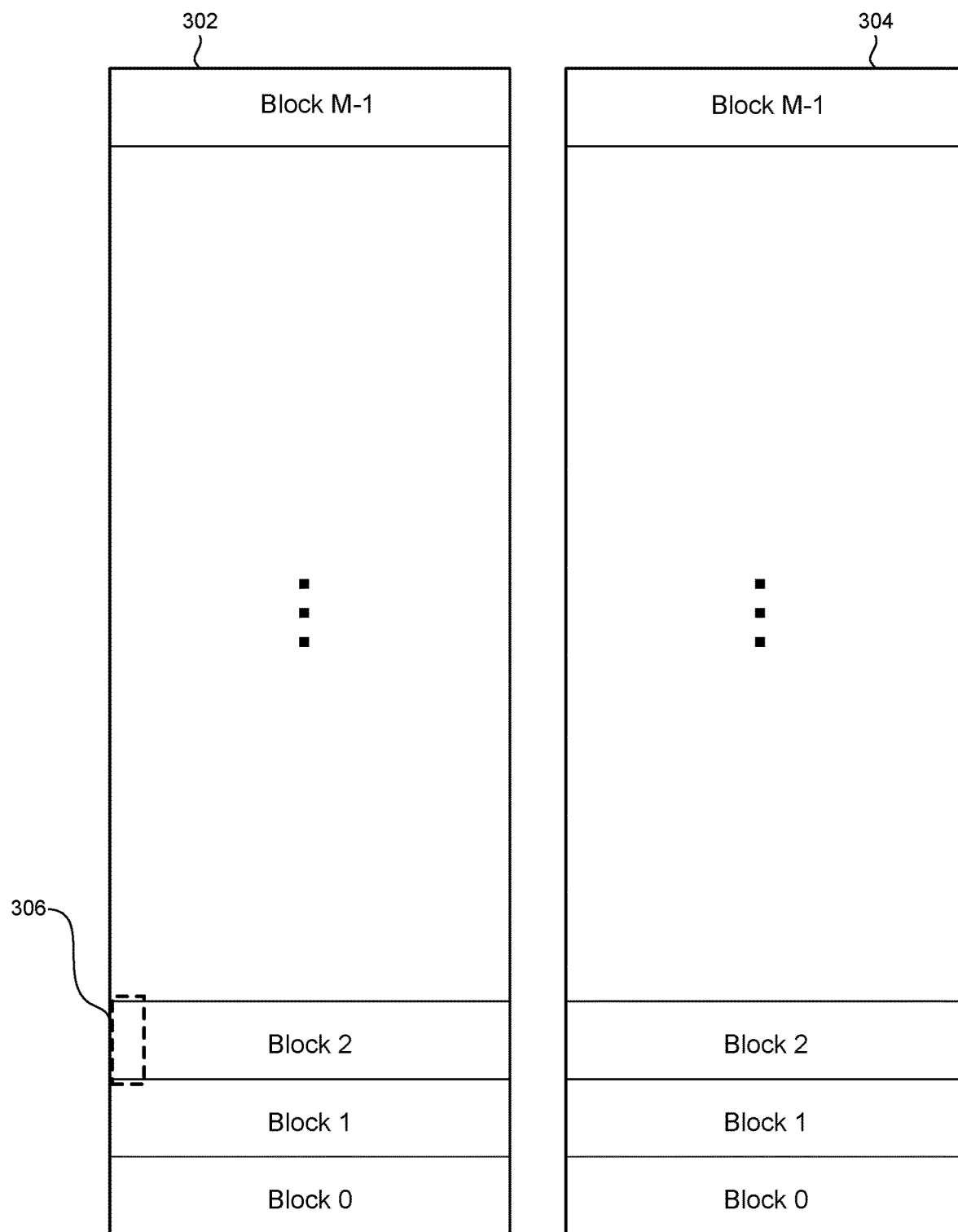
FIG. 4A is a block diagram of a memory structure having two planes.

FIG. 4A is a block diagram explaining one example organization of memory structure 326, which is divided into two planes 302 and 304. Each plane is then divided into M blocks. In one example, each plane has about 2000 blocks.

However, different numbers of blocks and planes can also be used. In on embodiment, a block of memory cells is a unit of erase. That is, all memory cells of a block are erased together. In other embodiments, memory cells can be grouped into blocks for other reasons, such as to organize the memory structure 126 to enable the signaling and selection circuits. In some embodiments, a block represents a groups of connected memory cells as the memory cells of a block share a common set of word lines.

Figure 4B:
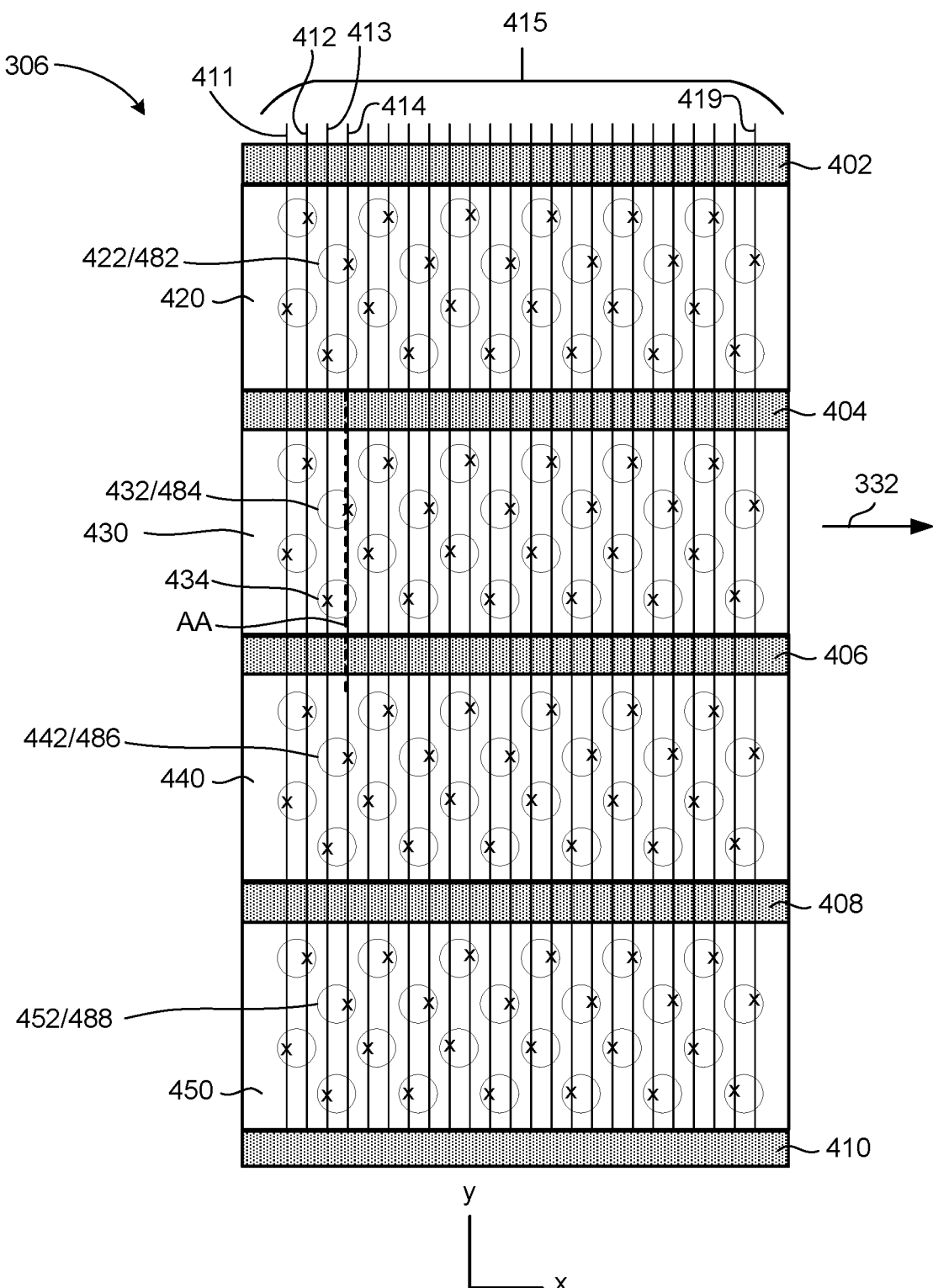
FIG. 4B depicts a top view of a portion of a block of memory cells.

FIGS. 4B-4F depict an example three dimensional ("3D") NAND structure that corresponds to the structure of FIG. 3 and can be used to implement memory structure 326 of FIG. 2. FIG. 4B is a block diagram depicting a top view of a portion of one block from memory structure 326. The portion of the block depicted in FIG. 4B corresponds to portion 306 in block 2 of FIG. 4A. As can be seen from FIG. 4B, the block depicted in FIG. 4B extends in the direction of 332. In one embodiment, the memory array has many layers; however, FIG. 4B only shows the top layer.

FIG. 4B depicts a plurality of circles that represent the vertical columns. Each of the vertical columns include multiple select transistors (also referred to as a select gate or selection gate) and multiple memory cells. In one embodiment, each vertical column implements a NAND string. For example, FIG. 4B depicts vertical columns 422, 432, 442 and 452. Vertical column 422 implements NAND string 482. Vertical column 432 implements NAND string 484. Vertical column 442 implements NAND string 486. Vertical column 452 implements NAND string 488. More details of the vertical columns are provided below. Since the block depicted in FIG. 4B extends in the direction of arrow 330 and in the direction of arrow 332, the block includes more vertical columns than depicted in FIG. 4B

FIG. 4B also depicts a set of bit lines 415, including bit lines 411, 412, 413, 414, . . . 419. FIG. 4B shows twenty four bit lines because only a portion of the block is depicted. It is contemplated that more than twenty four bit lines connected to vertical columns of the block. Each of the circles representing vertical columns has an "x" to indicate its connection to one bit line. For example, bit line 414 is connected to vertical columns 422, 432, 442 and 452.

The block depicted in FIG. 4B includes a set of local interconnects 402, 404, 406, 408 and 410 that connect the various layers to a source line below the vertical columns. Local interconnects 402, 404, 406, 408 and 410 also serve to divide each layer of the block into four regions; for example, the top layer depicted in FIG. 4B is divided into regions 420, 430, 440 and 450, which are referred to as fingers. In the layers of the block that implement memory cells, the four regions are referred to as word line fingers that are separated by the local interconnects. In one embodiment, the word line fingers on a common level of a block connect together to form a single word line. In another embodiment, the word line fingers on the same level are not connected together. In one example implementation, a bit line only connects to one vertical column in each of regions 420, 430, 440 and 450. In that implementation, each block has sixteen rows of active columns and each bit line connects to four rows in each block. In one embodiment, all of four rows connected to a common bit line are connected to the same word line (via different word line fingers on the same level that are connected together); therefore, the system uses the source side selection lines and the drain side selection lines to choose one (or another subset) of the four to be subjected to a memory operation (program, verify, read, and/or erase).

Although FIG. 4B shows each region having four rows of vertical columns, four regions and sixteen rows of vertical columns in a block, those exact numbers are an example implementation. Other embodiments may include more or less regions per block, more or less rows of vertical columns per region and more or less rows of vertical columns per block.

FIG. 4B also shows the vertical columns being staggered. In other embodiments, different patterns of staggering can be used. In some embodiments, the vertical columns are not staggered.

Figure 4C:
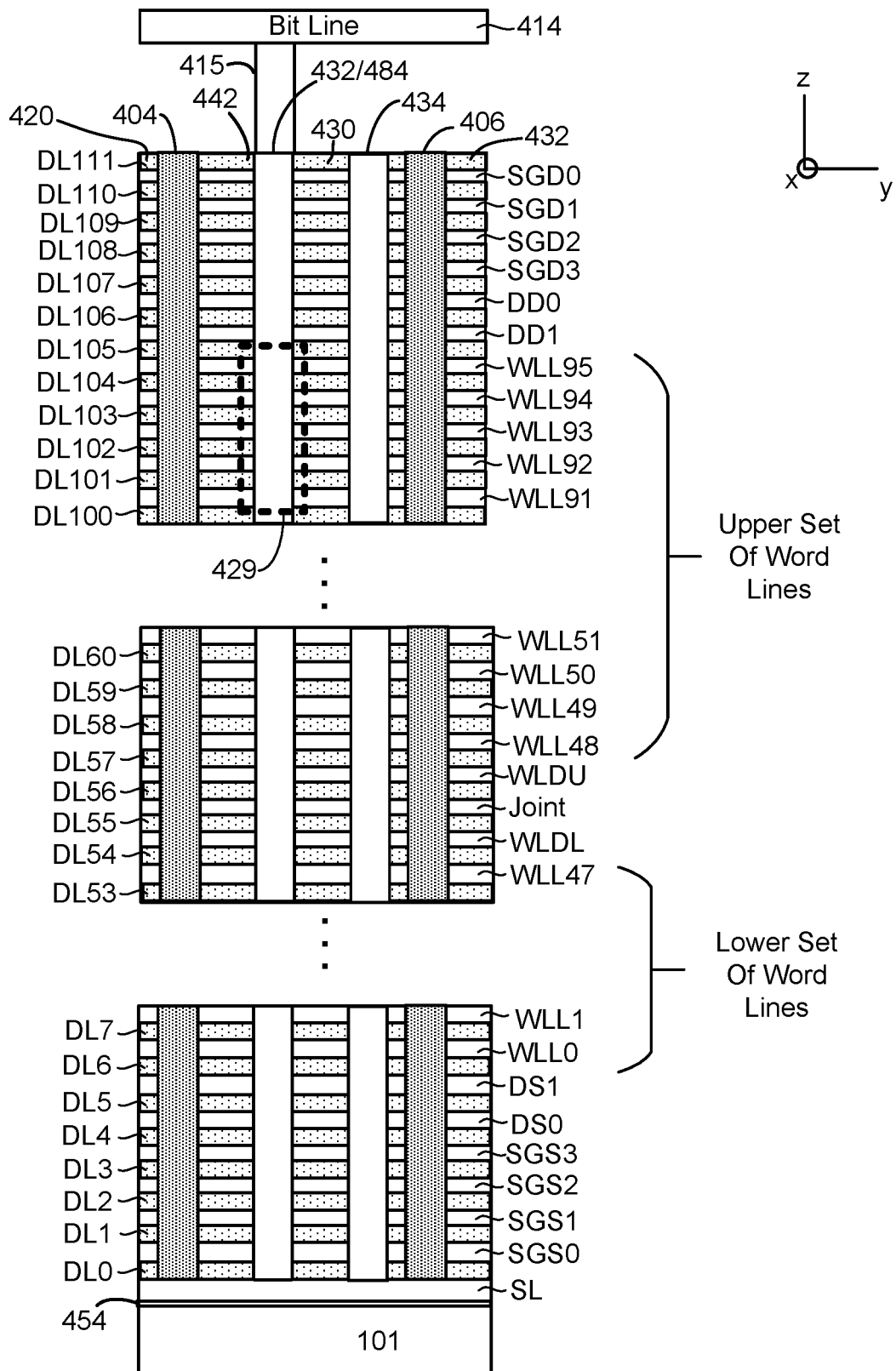
FIG. 4C depicts a cross sectional view of a portion of a block of memory cells.

FIG. 4C depicts a portion of one embodiment of a three dimensional memory structure 326 showing a cross-sectional view along line AA of FIG. 4B. This cross sectional view cuts through vertical columns 432 and 434 and region 430 (see FIG. 4B). The structure of FIG. 4C includes four drain side select layers SGD0, SGD1, SGD2 and SGD3; four source side select layers SGS0, SGS1, SGS2 and SGS3; six dummy word line layers DD0, DD1, DS0, DS1, WLDL, WLDU; and ninety six data word line layers WLL0-WLL95 for connecting to data memory cells. Other embodiments can implement more or less than four drain side select layers, more or less than four source side select layers, more or less than six dummy word line layers, and more or less than ninety six word lines. Vertical columns 432 and 434 are depicted protruding through the drain side select layers, source side select layers, dummy word line layers and word line layers. In one embodiment, each vertical column comprises a vertical NAND string. For example, vertical column 432 comprises NAND string 484. Below the vertical columns and the layers listed below is substrate 101, an insulating film 454 on the substrate, and source line SL. The NAND string of vertical column 432 has a source end at a bottom of the stack and a drain end at a top of the stack. As in agreement with FIG. 4B, FIG. 4C show vertical column 432 connected to Bit Line 414 via connector 415. Local interconnects 404 and 406 are also depicted.

For ease of reference, drain side select layers SGD0, SGD1, SGD2 and SGD3; source side select layers SGS0, SGS1, SGS2 and SGS3; dummy word line layers DD0, DD1, DS0, DS1, WLDL and WLDU; and word line layers WLL0-WLL95 collectively are referred to as the conductive layers. In one embodiment, the conductive layers are made from a combination of TiN and Tungsten. In other embodiments, other materials can be used to form the conductive layers, such as doped polysilicon, metal such as Tungsten or metal silicide. In some embodiments, different conductive layers can be formed from different materials. Between conductive layers are dielectric layers DL0-DL111. For example, dielectric layers DL104 is above word line layer WLL94 and below word line layer WLL95. In one embodiment, the dielectric layers are made from $SiO_2$. In other embodiments, other dielectric materials can be used to form the dielectric layers.

The non-volatile memory cells are formed along vertical columns which extend through alternating conductive and dielectric layers in the stack. In one embodiment, the memory cells are arranged in NAND strings. The word line layers WLL0-WLL95 connect to memory cells (also called data memory cells). Dummy word line layers DD0, DD1, DS0, DS1, WLDL and WLDU connect to dummy memory cells. A dummy memory cell does not store and is not eligible to store host data (data provided from the host, such as data from a user of the host), while a data memory cell is eligible to store host data. In some embodiments, data memory cells and dummy memory cells may have a same structure. A dummy word line is connected to dummy memory cells. Drain side select layers SGD0, SGD1, SGD2 and SGD3 are used to electrically connect and disconnect NAND strings from bit lines. Source side select layers SGS0, SGS1, SGS2 and SGS3 are used to electrically connect and disconnect NAND strings from the source line SL.

FIG. 4C also shows a Joint area. In one embodiment it is expensive and/or challenging to etch ninety six word line layers intermixed with dielectric layers. To ease this burden, one embodiment includes laying down a first stack of forty eight word line layers alternating with dielectric layers, laying down the Joint area, and laying down a second stack of forty eight word line layers alternating with dielectric layers. The Joint area is positioned between the first stack and the second stack. The Joint area is used to connect to the first stack to the second stack. In FIG. 4C, the first stack is labeled as the "Lower Set of Word Lines" and the second stack is labeled as the "Upper Set of Word Lines." In one embodiment, the Joint area is made from the same materials as the word line layers. In one example set of implementations, the plurality of word lines (control lines) comprises a first stack of alternating word line layers and dielectric layers, a second stack of alternating word line layers and dielectric layers, and a joint area between the first stack and the second stack, as depicted in FIG. 4C.

Figure 4D:
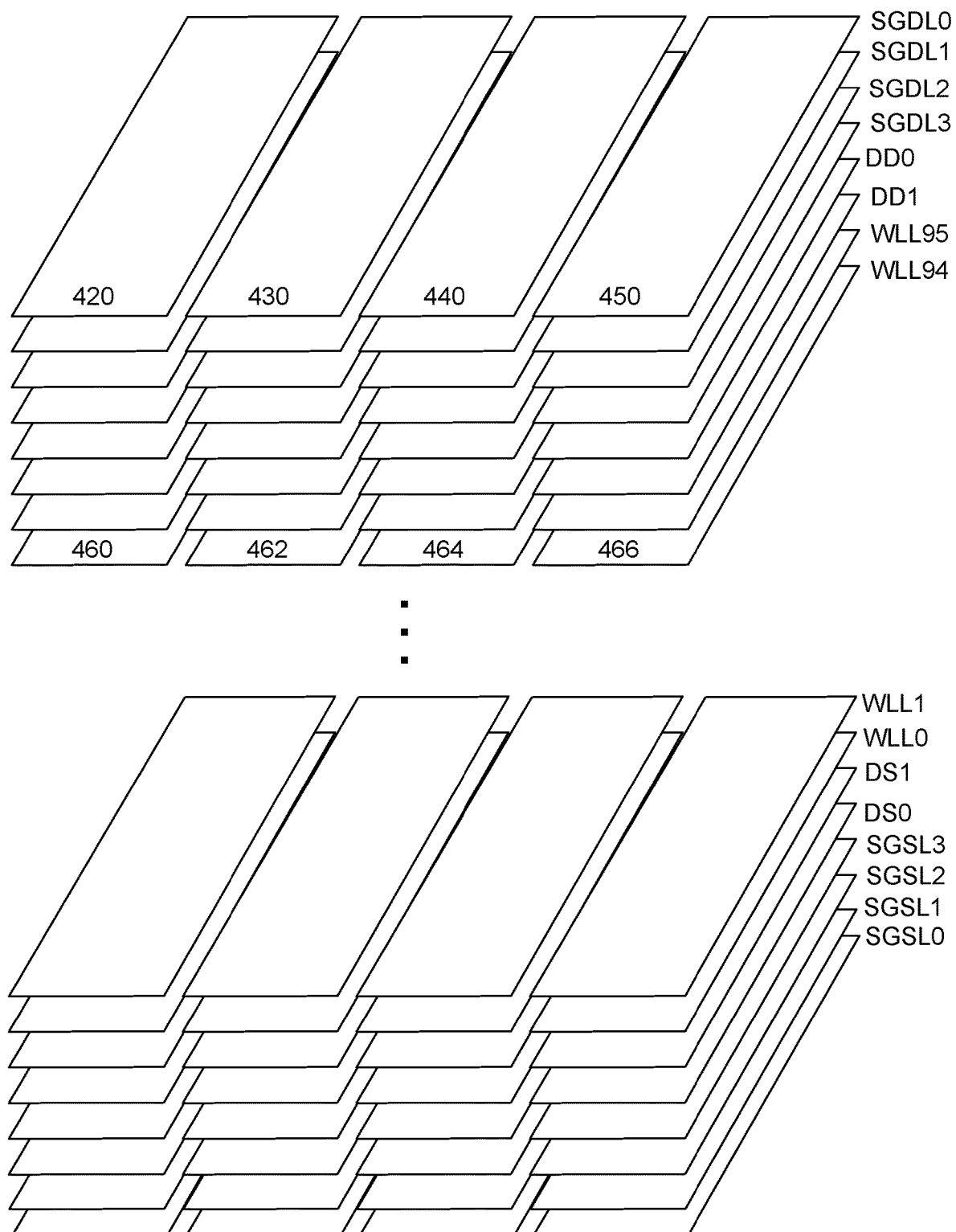
FIG. 4D depicts a view of the select gate layers and word line layers.

FIG. 4D depicts a logical representation of the conductive layers (SGD0, SGD1, SGD2, SGD3, SGS0, SGS1, SGS2, SGS3, DD0, DD1, DS0, DS1, and WLL0-WLL95) for the block that is partially depicted in FIG. 4C. As mentioned above with respect to FIG. 4B, in one embodiment local interconnects 402, 404, 406, 408 and 410 break up the conductive layers into four regions/fingers (or sub-blocks). For example, word line layer WLL94 is divided into regions 460, 462, 464 and 466. For word line layers (WLL0-WLL127), the regions are referred to as word line fingers; for example, word line layer WLL126 is divided into word line fingers 460, 462, 464 and 466. For example, region 460 is one word line finger on one word line layer. In one embodiment, the four word line fingers on a same level are connected together. In another embodiment, each word line finger operates as a separate word line.

Drain side select gate layer SGD0 (the top layer) is also divided into regions 420, 430, 440 and 450, also known as fingers or select line fingers. In one embodiment, the four select line fingers on a same level are connected together. In another embodiment, each select line finger operates as a separate word line.

Figure 4E:
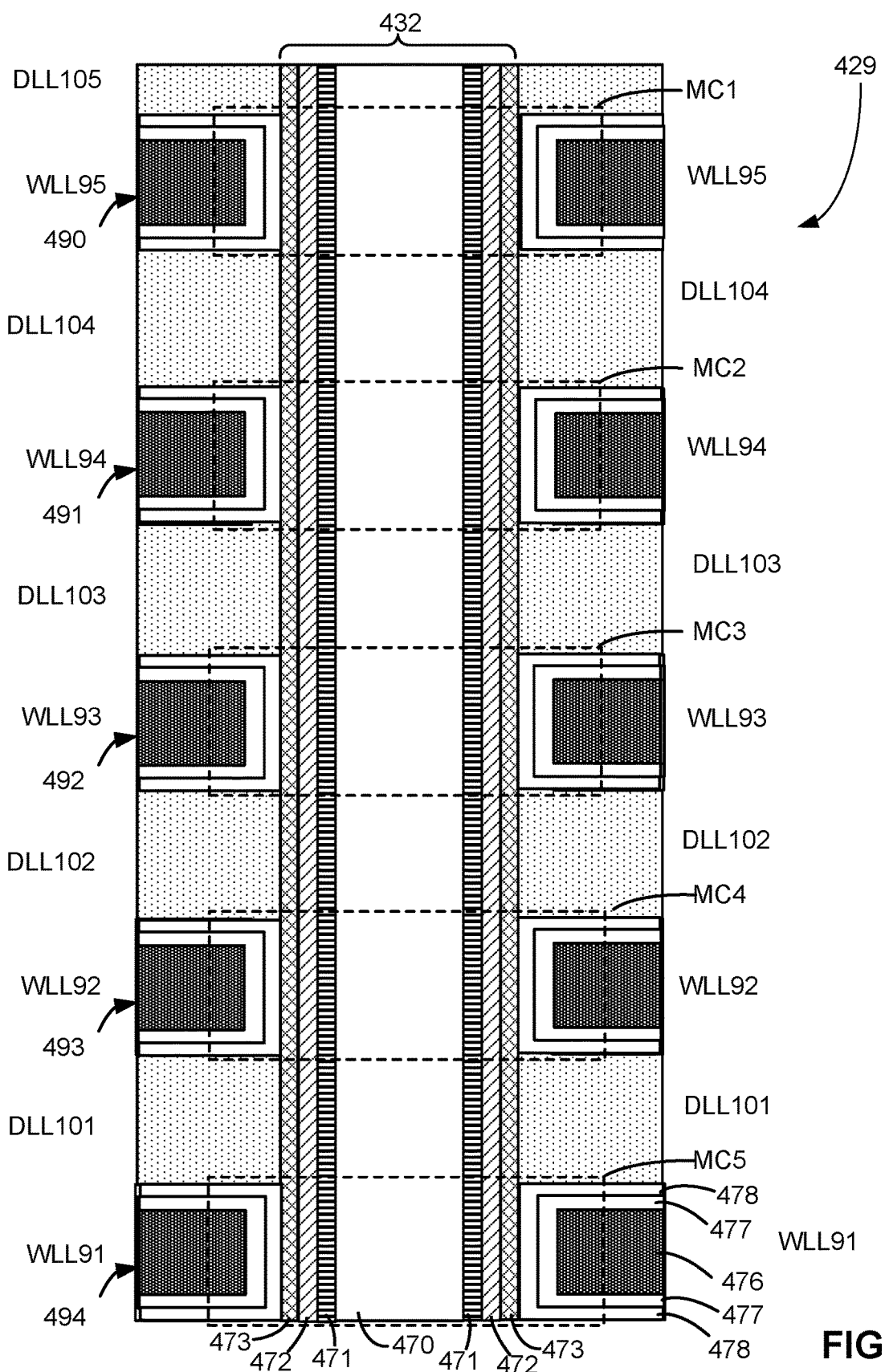
FIG. 4E is a cross sectional view of a vertical column of memory cells.

FIG. 4E depicts a cross sectional view of region 429 of FIG. 4C that includes a portion of vertical column 432 (a memory hole). In one embodiment, the vertical columns are round; however, in other embodiments other shapes can be used. In one embodiment, vertical column 432 includes an inner core layer 470 that is made of a dielectric, such as $SiO_2$. Other materials can also be used. Surrounding inner core 470 is polysilicon channel 471. Materials other than polysilicon can also be used. Note that it is the channel 471 that connects to the bit line and the source line. Surrounding channel 471 is a tunneling dielectric 472. In one embodiment, tunneling dielectric 472 has an ONO structure. Surrounding tunneling dielectric 472 is charge trapping layer 473, such as (for example) Silicon Nitride. Other memory materials and structures can also be used. The technology described herein is not limited to any particular material or structure.

FIG. 4E depicts dielectric layers DLL105, DLL104, DLL103, DLL102 and DLL101, as well as word line layers WLL95, WLL94, WLL93, WLL92, and WLL91. Each of the word line layers includes a word line region 476 surrounded by an aluminum oxide layer 477, which is surrounded by a blocking oxide ($SiO_2$) layer 478. The physical interaction of the word line layers with the vertical column forms the memory cells. Thus, a memory cell, in one embodiment, comprises channel 471, tunneling dielectric 472, charge trapping layer 473, blocking oxide layer 478, aluminum oxide layer 477 and word line region 476. For example, word line layer WLL95 and a portion of vertical column 432 comprise a memory cell MC1. Word line layer WLL94 and a portion of vertical column 432 comprise a memory cell MC2. Word line layer WLL93 and a portion of vertical column 432 comprise a memory cell MC3. Word line layer WLL92 and a portion of vertical column 432 comprise a memory cell MC4. Word line layer WLL91 and a portion of vertical column 432 comprise a memory cell MC5. In other architectures, a memory cell may have a different structure; however, the memory cell would still be the storage unit.

When a memory cell is programmed, electrons are stored in a portion of the charge trapping layer 473 which is associated with the memory cell. These electrons are drawn into the charge trapping layer 473 from the channel 471, through the tunneling dielectric 472, in response to an appropriate voltage on word line region 476. The threshold voltage (Vth) of a memory cell is increased in proportion to the amount of stored charge. In one embodiment, the programming is achieved through Fowler-Nordheim tunneling of the electrons into the charge trapping layer. During an erase operation, the electrons return to the channel or holes are injected into the charge trapping layer to recombine with electrons. In one embodiment, erasing is achieved using hole injection into the charge trapping layer via a physical mechanism such as gate induced drain leakage (GIDL).

Figure 4F:
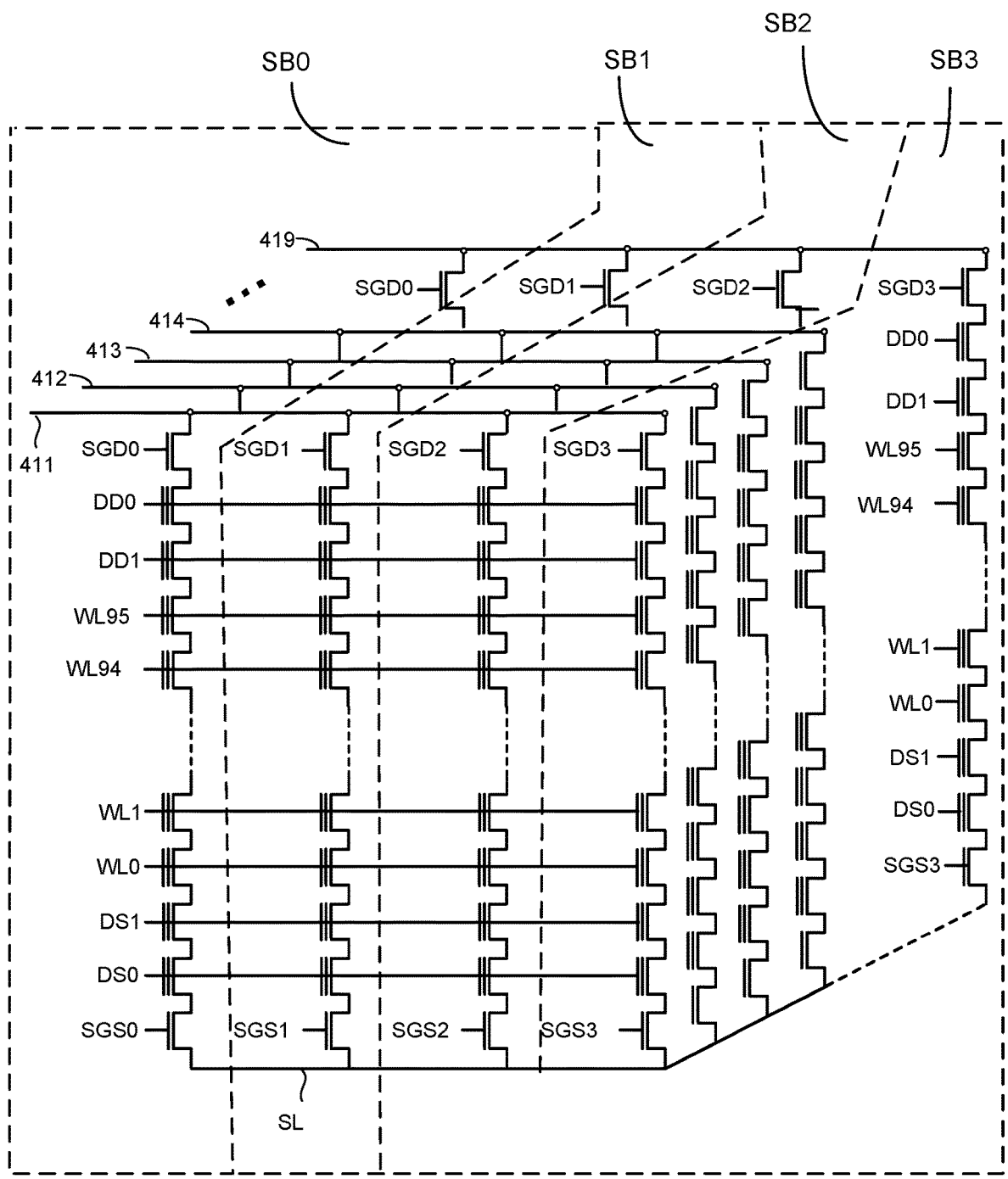
FIG. 4F is a schematic of a plurality of NAND strings showing multiple sub-blocks.

FIG. 4F is a schematic diagram of a portion of the memory depicted in in FIGS. 3-4E. FIG. 4F shows physical word lines WLL0-WLL95 running across the entire block. The structure of FIG. 4F corresponds to portion 306 in Block 2 of FIGS. 4A-E, including bit lines 411, 412, 413, 414, ... 419. Within the block, each bit line is connected to four NAND strings. Drain side selection lines SGD0, SGD1, SGD2 and SGD3 are used to determine which of the four NAND strings connect to the associated bit line(s). Source side selection lines SGS0, SGS1, SGS2 and SGS3 are used to determine which of the four NAND strings connect to the common source line. The block can also be thought of as divided into four sub-blocks SB0, SB1, SB2 and SB3. Sub-block SB0 corresponds to those vertical NAND strings controlled by SGD0 and SGS0, sub-block SB1 corresponds to those vertical NAND strings controlled by SGD1 and SGS1, sub-block SB2 corresponds to those vertical NAND strings controlled by SGD2 and SGS2, and sub-block SB3 corresponds to those vertical NAND strings controlled by SGD3 and SGS3.

Although the example memory system of FIGS. 3-4F is a three dimensional memory structure that includes vertical NAND strings with charge-trapping material, other (2D and 3D) memory structures can also be used with the technology described herein.

Figure 5:
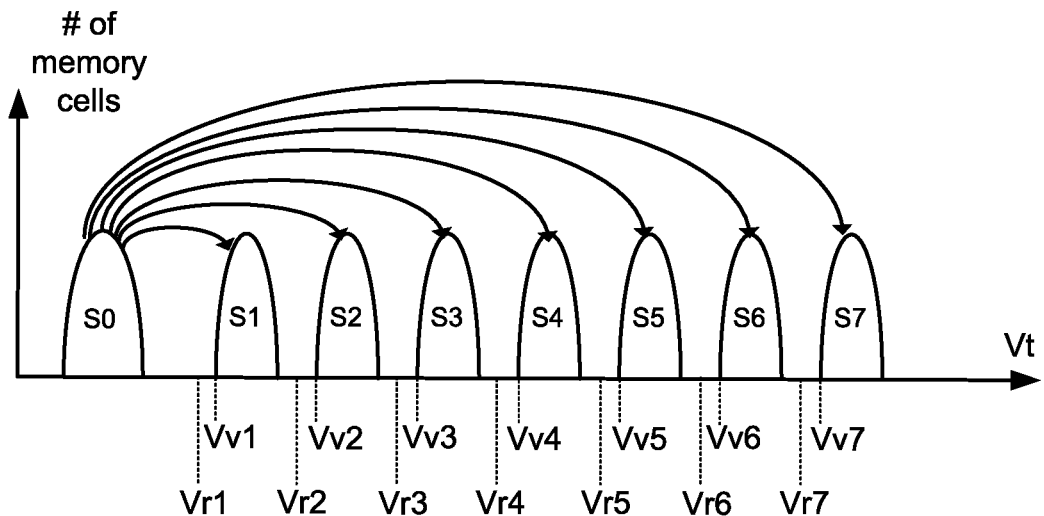
FIG. 5 depicts threshold voltage distributions.

The memory systems discussed above can be erased, programmed and read. At the end of a successful programming process (with verification), the threshold voltages of the memory cells should be within one or more distributions of threshold voltages for programmed memory cells or within a distribution of threshold voltages for erased memory cells, as appropriate. FIG. 5 is a graph of threshold voltage versus number of memory cells, and illustrates example threshold voltage distributions for the memory array when each memory cell stores three bits of data. Other embodiments, however, may use other data capacities per memory cell (e.g., such as one, two, four, or five bits of data per memory cell). FIG. 5 shows eight threshold voltage distributions, corresponding to eight data states. For a data state N, that data state N has higher threshold voltages than data state N−1 and lower threshold voltages than data state N+1. The first threshold voltage distribution (data state) S0 represents memory cells that are erased. The other seven threshold voltage distributions (data states) S1-S7 represent memory cells that are programmed and, therefore, are also called programmed states or programmed data states. In some embodiments, data states S1-S7 can overlap, with controller 122 relying on error correction to identify the correct data being stored.

FIG. 5 shows seven read reference voltages, Vr1, Vr2, Vr3, Vr4, Vr5, Vr6, and Vr7 for reading data from memory cells. By testing (e.g., performing sense operations) whether the threshold voltage of a given memory cell is above or below the seven read reference voltages, the system can determine what data state (i.e., S0, S1, S2, S3, . . . ) a memory cell is in.

FIG. 5 also shows seven verify reference voltages, Vv1, Vv2, Vv3, Vv4, Vv5, Vv6, and Vv7 (also referred to as verify target voltages). When programming memory cells to data state S1, the system will test whether those memory cells have a threshold voltage greater than or equal to Vv1. When programming memory cells to data state S2, the system will test whether the memory cells have threshold voltages greater than or equal to Vv2. When programming memory cells to data state S3, the system will determine whether memory cells have their threshold voltage greater than or equal to Vv3. When programming memory cells to data state S4, the system will test whether those memory cells have a threshold voltage greater than or equal to Vv4. When programming memory cells to data state S5, the system will test whether those memory cells have a threshold voltage greater than or equal to Vv5. When programming memory cells to data state S6, the system will test whether those memory cells have a threshold voltage greater than or equal to Vv6. When programming memory cells to data state S7, the system will test whether those memory cells have a threshold voltage greater than or equal to Vv7.

In one embodiment, known as full sequence programming, memory cells can be programmed from the erased data state S0 directly to any of the programmed data states S1-S7. For example, a population of memory cells to be programmed may first be erased so that all memory cells in the population are in erased data state S0. Then, a programming process is used to program memory cells directly into data states S1, S2, S3, S4, S5, S6, and/or S7. For example, while some memory cells are being programmed from data state S0 to data state S1, other memory cells are being programmed from data state S0 to data state S2 and/or from data state S0 to data state S3, and so on. The arrows of FIG. 5 represent the full sequence programming. The technology described herein can also be used with other types of programming in addition to full sequence programming including (but not limited to) multiple stage/phase programming.

Each threshold voltage distribution (data state) of FIG. 5 corresponds to predetermined values for the set of data bits stored in the memory cells. The specific relationship between the data programmed into the memory cell and the threshold voltage levels of the memory cell depends upon the data encoding scheme adopted for the memory cells. In one embodiment, data values are assigned to the threshold voltage ranges using a Gray code assignment so that if the threshold voltage of a memory erroneously shifts to its neighboring physical state, only one bit will be affected.

In general, during verify operations and read operations, the selected word line is connected to a voltage (one example of a reference signal), a level of which is specified for each read operation (e.g., see read reference voltages Vr1, Vr2, Vr3, Vr4, Vr5, Vr6, and Vr7, of FIG. 5) or verify operation (e.g. see verify reference voltages Vv1, Vv2, Vv3, Vv4, Vv5, Vv6, and Vv7 of FIG. 5) in order to determine whether a threshold voltage of the concerned memory cell has reached such level. After applying the word line voltage, the conduction current of the memory cell is measured to determine whether the memory cell turned on (conducted current) in response to the voltage applied to the word line. If the conduction current is measured to be greater than a certain value, then it is assumed that the memory cell turned on and the voltage applied to the word line is greater than the threshold voltage of the memory cell. If the conduction current is not measured to be greater than the certain value, then it is assumed that the memory cell did not turn on and the voltage applied to the word line is not greater than the threshold voltage of the memory cell. During a read or verify process, the unselected memory cells are provided with one or more read pass voltages (also referred to as bypass voltages) at their control gates so that these memory cells will operate as pass gates (e.g., conducting current regardless of whether they are programmed or erased).

There are many ways to measure the conduction current of a memory cell during a read or verify operation. In one example, the conduction current of a memory cell is measured by the rate it discharges or charges a dedicated capacitor in the sense amplifier. In another example, the conduction current of the selected memory cell allows (or fails to allow) the NAND string that includes the memory cell to discharge a corresponding bit line. The voltage on the bit line is measured after a period of time to see whether it has been discharged or not. Note that the technology described herein can be used with different methods known in the art for verifying/reading. Other read and verify techniques known in the art can also be used.

As discussed above, it is possible that memory cells can become over programmed. For example, consider the example of a memory cell intended to be programmed to data state S4. The programming process is designed to increase the threshold voltage of the memory cell from the threshold voltage distribution for data state S0 to data S4 by applying a programming signal as a set of programming pulses that increase in magnitude by a step size and testing between program pulses as to whether the memory cell's threshold voltage has reached Vv4. However, due to a structural variation or increase in programming speed due to program/erase cycling, it is possible that when the memory cell's threshold voltage has reached Vv4 it has also surpassed Vr5, which may lead to an error when reading the memory cell later. This is one example of over programming. If a small number of memory cells become over programmed, the ECC process during reading may be able to correct the errors. However, if too many memory cells are over programmed or have errors, then the ECC may not be able to correct all of the errors and the reading process may fail, resulting in loss of data.

To prevent loss of data, it is proposed that the non-volatile storage system include a mechanism to compensate for over programming during the programming process. That is, after the programming process starts for a set of data and target memory cells and prior to the programming process completing for the set of data and the target memory cells, the system determines whether there is more than a threshold number of over programmed memory cells and, if so, then the system adjusts the programming process mid-way through the programming process (e.g., in-flight) to compensate for the over programming that has occurred so far in the currently being performed programming process.

Figure 6A:
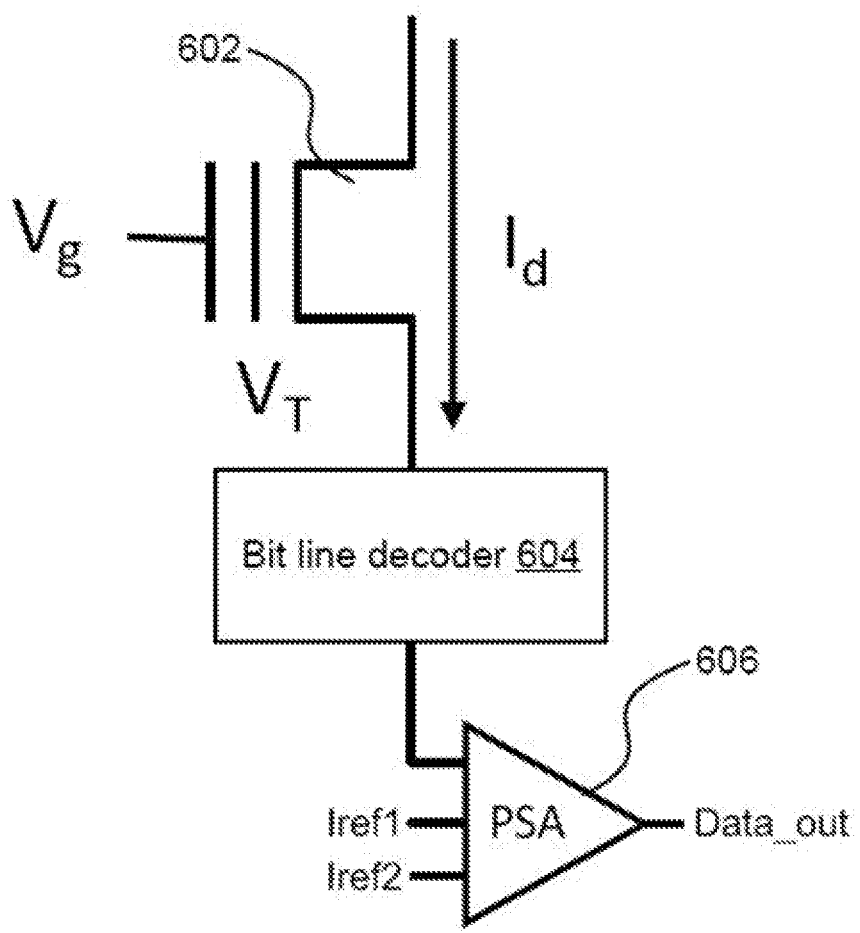
FIG. 6A depicts one embodiment of a memory cell transistor connected to a programmable sense amplifier during a logic operation.

FIG. 6A depicts one embodiment of a memory cell transistor 602 connected to a programmable sense amplifier 606 during a logic operation. As depicted, the source-side or bit line side of the memory cell transistor 602 connects to a bit line decoder 604 that connects to the programmable sense amplifier 606. The programmable sense amplifier 606 may compare the memory cell current Id flowing through the memory cell transistor 602 with two different current thresholds Iref1 and Iref2. In one example, the first current threshold Iref1 may be compared with the memory cell current Id to determine whether the memory cell current Id is greater than the first current threshold Iref1; if the memory cell current Id is greater than the first current threshold Iref1, then the programmable sense amplifier 606 may compare the second current threshold Iref2 with the memory cell current Id. The data output Data_out of the programmable sense amplifier 606 may output a logic "1" or "0" depending on the results of the current comparisons. In some cases, the programmable sense amplifier 606 may compare the memory cell current Id with the first current threshold Iref1 and the memory cell current Id with the second current threshold Iref2 concurrently. In one example, the programmable sense amplifier 606 may use current mirrors to mirror the memory cell current Id to two different current comparators corresponding with the two different current thresholds Iref1 and Iref2. The programmable sense amplifier 606 may comprise a programmable double threshold sense amplifier that may output a first data value (e.g., a logic "1") if the memory cell current is between two different current thresholds and output a second data value (e.g., a logic "0") different from the first data value if the memory cell current is not between the two different current thresholds.

In one example, if the memory cell current Id is greater than the first current threshold Iref1 (e.g., 1 uA) and less than the second current threshold Iref2 (e.g., 10 uA), then the programmable sense amplifier 606 may output at Data_out a first data value (e.g., a "0"); however, if the memory cell current Id is less than the first current threshold Iref1 or if the memory cell current Id is greater than the second current threshold Iref2, then the programmable sense amplifier 606 may output at Data_out a second data value (e.g., a "1") different from the first data value. In another example, if the memory cell current Id is greater than the first current threshold Iref1, then the programmable sense amplifier 606 may output at Data_out a first data value (e.g., a "0"); however, if the memory cell current Id is less than the first current threshold Iref1, then the programmable sense amplifier 606 may output at Data_out a second data value (e.g., a "1") different from the first data value.

Prior to the logic operation, the threshold voltage $V_T$ of the memory cell transistor 602 may have been set or programmed based on a first operand for the logic operation. During the logic operation, the gate voltage VG of the memory cell transistor 602 may be set to a particular voltage based on a second operand for the logic operation. In one example, the gate voltage VG that is applied to the memory cell transistor 602 during the logic operation may correspond with a word line voltage that is applied to a word line connected to the gate of the memory cell transistor 602. In one embodiment, the memory cell transistor 602 may comprise one of the memory cell transistors within a NAND string and the application of the gate voltage VG to the memory cell transistor 602 during the logic operation may correspond with a read operation.

Figure 6B:
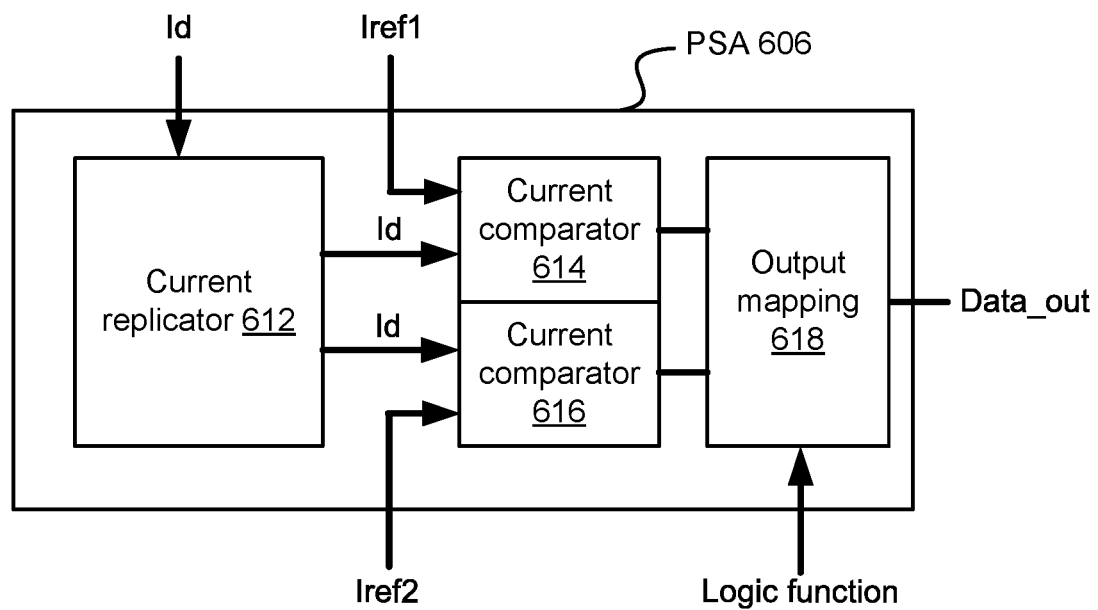
FIG. 6B depicts one embodiment of the programmable sense amplifier 606 of FIG. 6A.

FIG. 6B depicts one embodiment of the programmable sense amplifier 606 in FIG. 6A. As depicted, the programmable sense amplifier 606 includes a current replicator 612, an output mapping circuit 618, and current comparators 614 and 616. The current replicator 612 takes as input a memory cell current Id and outputs replicated versions of the memory cell current Id. The current replicator 612 may comprise a current mirror circuit. The current comparator 614 compares one of the replicated versions of the memory cell current Id with a first current threshold Iref1 (e.g., 1 uA). The current comparator 616 compares another of the replicated versions of the memory cell current Id with a second current threshold Iref2 (e.g., 10 uA). The output mapping circuit 618 takes as inputs the resulting outputs of the current comparators 614 and 616 and a logic function corresponding with the logic operation being performed and outputs Data_out representing the result of the logic operation. The output mapping circuit 618 may utilize a lookup table in order to map the outputs of the current comparators 614 and 616 and the logic function to the appropriate output Data_out.

In one example, if the logic function corresponds with an OR function, then if the memory cell current Id is greater than the first current threshold Iref1, then the output mapping circuit 618 will output a logic "1,"; otherwise, if the memory cell current Id is not greater than the first current threshold Iref1, then the output mapping circuit 618 will output a logic "0." In another example, if the logic function corresponds with an AND function, then if the memory cell current Id is greater than the first current threshold Iref1, then the output mapping circuit 618 will output a logic "1,"; otherwise, if the memory cell current Id is not greater than the first current threshold Iref1, then the output mapping circuit 618 will output a logic "0." In another example, if the logic function corresponds with an XOR function, then if the memory cell current Id is greater than the first current threshold Iref1 and is less than the second current threshold Iref2, then the output mapping circuit 618 will output a logic "1,"; however, if the memory cell current Id is not between the first current threshold Iref1 and the second current threshold Iref2 (e.g., the memory cell current Id is greater than the second current threshold Iref2 or is less than the first current threshold Iref1), then the output mapping circuit 618 will output a logic "0." In another example, if the logic function corresponds with an IMP function, then if the memory cell current Id is greater than the first current threshold Iref1 and is less than the second current threshold Iref2, then the output mapping circuit 618 will output a logic "0,"; however, if the memory cell current Id is not between the first current threshold Iref1 and the second current threshold Iref2, then the output mapping circuit 618 will output a logic "1."

Figure 7A:
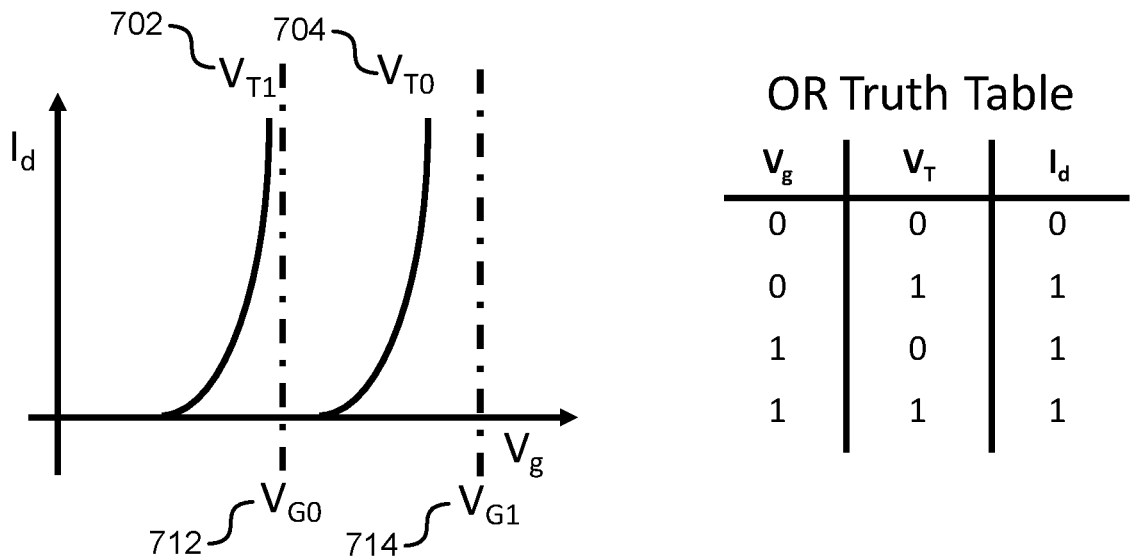
FIG. 7A depicts one embodiment of the threshold voltage and the gate voltage settings for a memory cell transistor during an OR operation.

FIG. 7A depicts one embodiment of the threshold voltage and the gate voltage settings for a first memory cell transistor, such as memory cell transistor 602 in FIG. 6A, during an OR operation. As depicted, if the first operand corresponding with the threshold voltage $V_T$ is a logic "0," then the threshold voltage for the first memory cell transistor is set to a voltage $V_{T0}$ 704 that is greater than the gate voltage $V_{G0}$ 712 corresponding with the second operand being a logic "0" and is less than the gate voltage $V_{G1}$ 714 corresponding with the second operand being a logic "1." If the first operand corresponding with the threshold voltage $V_T$ is a logic "1," then the threshold voltage for the first memory cell is set to a voltage $V_{T1}$ 702 that is less than the gate voltage $V_{G0}$ 712 corresponding with the second operand being a logic "0" and is less than the gate voltage $V_{G1}$ 714 corresponding with the second operand being a logic "1." With the threshold voltage and the gate voltage settings depicted in FIG. 7A, the logic OR operation may be performed using the first memory cell transistor.

If the two operands are both logic "0," then the gate voltage $V_{G0}$ applied to the first memory cell transistor will be less than the threshold voltage $V_{T0}$ for the first memory cell transistor causing the first memory cell transistor to be set into a non-conducting state and an output data value of logic "0" to be generated and output by the programmable sense amplifier, such as the programmable sense amplifier 606 in FIG. 6A. If the two operands are both logic "1," then the gate voltage $V_{G1}$ applied to the first memory cell transistor will be greater than the threshold voltage $V_{T1}$ for the first memory cell transistor causing the first memory cell transistor to be set into a conducting state and the output data value of logic "1" to be determined by the programmable sense amplifier. If the operand corresponding with the gate voltage is a logic "0" and the operand corresponding with the threshold voltage is a logic "1," then the gate voltage $V_{G0}$ applied to the first memory cell transistor will be greater than the threshold voltage $V_{T1}$ for the first memory cell transistor causing the first memory cell transistor to be set into a conducting state and the output data value of logic "1" to be output. If the operand corresponding with the gate voltage is a logic "1" and the operand corresponding with the threshold voltage is a logic "0," then the gate voltage $V_{G1}$ applied to the first memory cell transistor will be greater than the threshold voltage $V_{T0}$ for the first memory cell transistor causing the first memory cell transistor to be set into a conducting state and the output data value of logic "1" to be output.

Figure 7B:
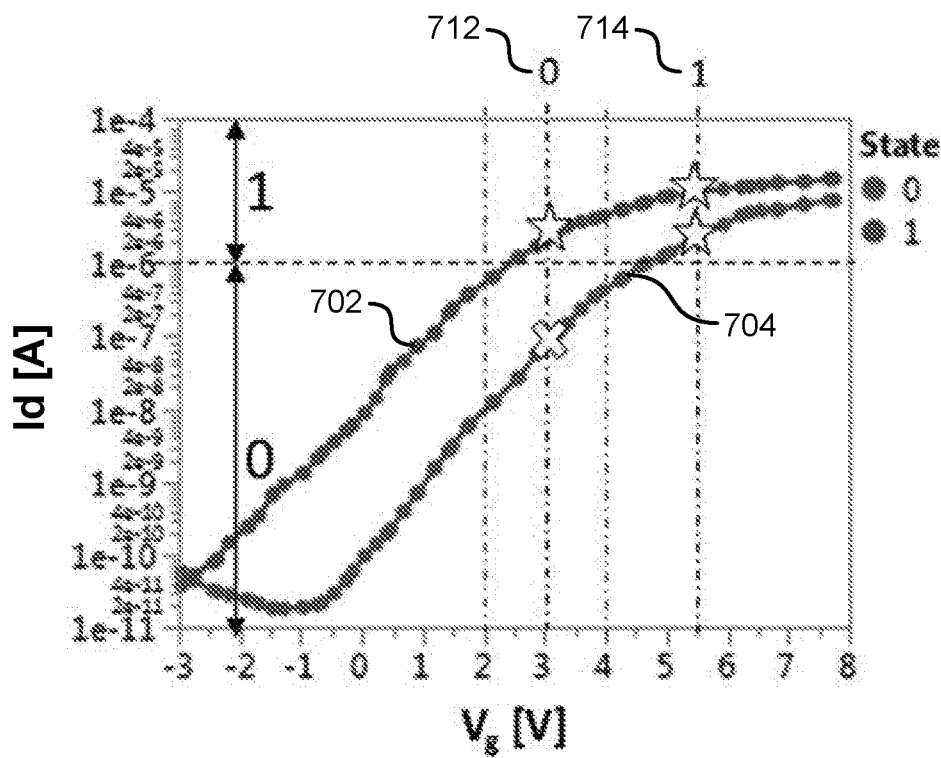
FIG. 7B depicts another embodiment of the threshold voltage and the gate voltage settings for the logic OR operation depicted in FIG. 7A.

FIG. 7B depicts another embodiment of the threshold voltage and the gate voltage settings for the logic OR operation depicted in FIG. 7A. As depicted, if the operand corresponding with the threshold voltage is a logic "0," then the memory cell transistor is programmed to the threshold voltage 704 that causes the memory cell transistor to output 1 uA of memory cell current with a gate voltage of 4.7V; however, if the operand corresponding with the threshold voltage is a logic "1," then the memory cell transistor is programmed to the threshold voltage 702 that causes the memory cell current to output 1 uA of memory cell current with a gate voltage of 2.5V. If the operand corresponding with the gate voltage is a logic "0," then a gate voltage 712 of 3V will be applied to the memory cell transistor during the logic OR operation. If the operand corresponding with the gate voltage is a logic "1," then a gate voltage 714 of 5.5V will be applied to the memory cell transistor during the logic OR operation.

Figure 7C:
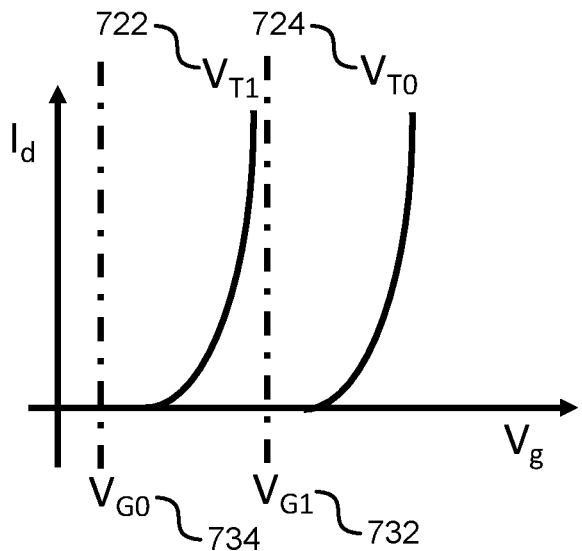
FIG. 7C depicts one embodiment of the threshold voltage and the gate voltage settings for a memory cell transistor during an AND operation.

FIG. 7C depicts one embodiment of the threshold voltage and the gate voltage settings for a first memory cell transistor, such as memory cell transistor 602 in FIG. 6A, during an AND operation. As depicted, if the first operand corresponding with the threshold voltage $V_T$ is a logic "0," then the threshold voltage for the first memory cell transistor is set to a voltage $V_{T0}$ 724 that is greater than the gate voltage $V_{G0}$ 734 corresponding with the second operand being a logic "0" and is greater than the gate voltage $V_{G1}$ 732 corresponding with the second operand being a logic "1." If the first operand corresponding with the threshold voltage $V_T$ is a logic "1," then the threshold voltage for the first memory cell is set to a voltage $V_{T1}$ 722 that is less than the gate voltage $V_{G1}$ 732 corresponding with the second operand being a logic "1" and is greater than the gate voltage $V_{G0}$ 734 corresponding with the second operand being a logic "0." With the threshold voltage and the gate voltage settings depicted in FIG. 7C, the logic AND operation may be performed using the first memory cell transistor.

If the two operands are both logic "0," then the gate voltage $V_{G0}$ 734 applied to the first memory cell transistor will be less than the threshold voltage $V_{T0}$ for the first memory cell transistor causing the first memory cell transistor to be set into a non-conducting state and an output data value of logic "0" to be output by the programmable sense amplifier, such as the programmable sense amplifier 606 in FIG. 6A. If the two operands are both logic "1," then the gate voltage $V_{G1}$ 732 applied to the first memory cell transistor will be greater than the threshold voltage $V_{T1}$ 722 for the first memory cell transistor causing the first memory cell transistor to be set into a conducting state and the output data value of logic "1" to be output by the programmable sense amplifier. If the operand corresponding with the gate voltage is a logic "0" and the operand corresponding with the threshold voltage is a logic "1," then the gate voltage $V_{G0}$ 734 applied to the first memory cell transistor will be less than the threshold voltage $V_{T1}$ 722 for the first memory cell transistor causing the first memory cell transistor to be set into a non-conducting state and the output data value of logic "0" to be output. If the operand corresponding with the gate voltage is a logic "1" and the operand corresponding with the threshold voltage is a logic "0," then the gate voltage $V_{G1}$ 732 applied to the first memory cell transistor will be less than the threshold voltage $V_{T0}$ 724 for the first memory cell transistor causing the first memory cell transistor to be set into a non-conducting state and the output data value of logic "0" to be output.

Figure 7D:
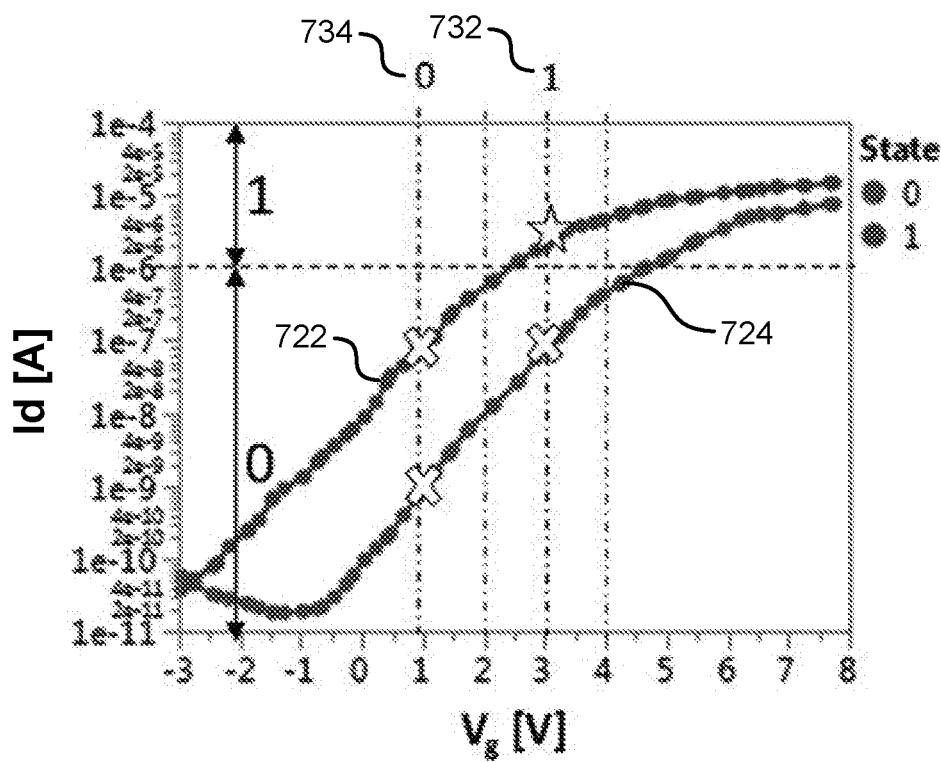
FIG. 7D depicts another embodiment of the threshold voltage and the gate voltage settings for the logic AND operation depicted in FIG. 7C.

FIG. 7D depicts another embodiment of the threshold voltage and the gate voltage settings for the logic AND operation depicted in FIG. 7C. As depicted, if the operand corresponding with the threshold voltage is a logic "0," then the memory cell transistor is programmed to the threshold voltage 724 that causes the memory cell transistor to output 1 uA of memory cell current with a gate voltage of 4.7V; however, if the operand corresponding with the threshold voltage is a logic "1," then the memory cell transistor is programmed to the threshold voltage 722 that causes the memory cell current to output 1 uA of memory cell current with a gate voltage of 2.5V. If the operand corresponding with the gate voltage is a logic "0," then a gate voltage 734 of 1V will be applied to the memory cell transistor during the logic AND operation. If the operand corresponding with the gate voltage is a logic "1," then a gate voltage 732 of 3V will be applied to the memory cell transistor during the logic AND operation.

Figures 7E, 7F:
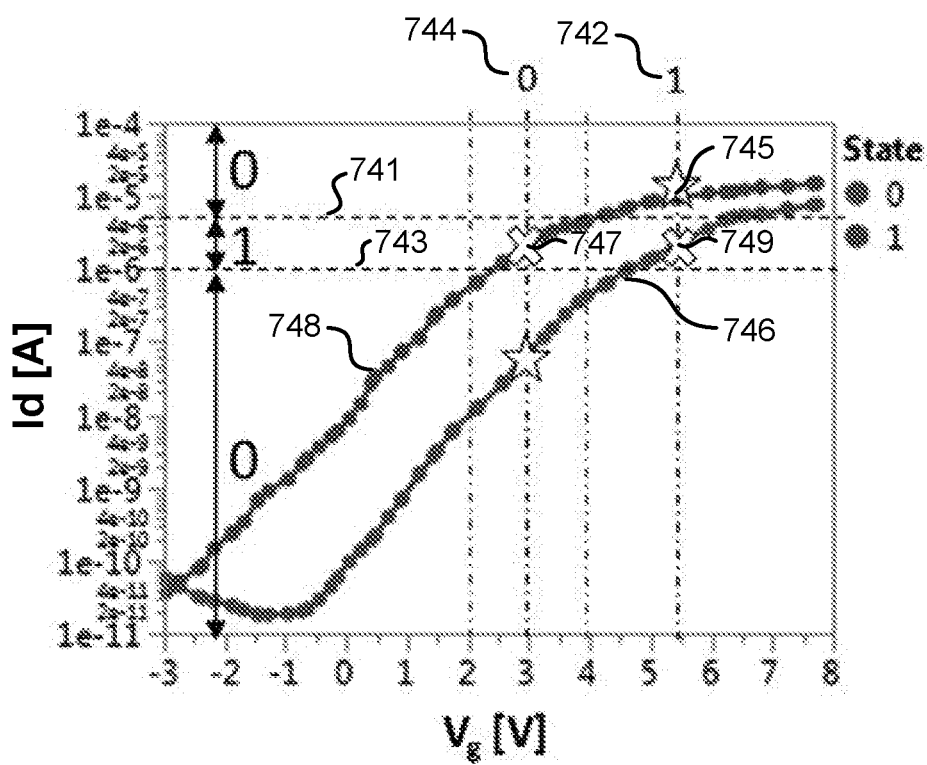
FIG. 7E depicts one embodiment of a truth table for an XOR function.
FIG. 7F depicts one embodiment of the threshold voltage and the gate voltage settings for performing a logic XOR operation using a memory cell transistor.

FIG. 7E depicts one embodiment of a truth table for an XOR function. FIG. 7F depicts one embodiment of the threshold voltage and the gate voltage settings for performing a logic XOR operation using a memory cell transistor, such as memory cell transistor 602 in FIG. 6A. The memory cell transistor may comprise a floating gate transistor or a charge trap transistor. The XOR operation may be performed using a memory cell transistor coupled to a programmable double threshold sense amplifier, such as the programmable sense amplifier 606 depicted in FIG. 6A. As depicted in FIG. 7F, if the operand corresponding with the threshold voltage is a logic "0," then the memory cell transistor is programmed to the threshold voltage 746 that causes the memory cell transistor to output 1 uA of memory cell current with a gate voltage of 4.7V; however, if the operand corresponding with the threshold voltage is a logic "1," then the memory cell transistor is programmed to the threshold voltage 748 that causes the memory cell current to output 1 uA of memory cell current with a gate voltage of 2.5V. If the operand corresponding with the gate voltage is a logic "0," then a gate voltage 744 of 3V will be applied to the memory cell transistor during the logic XOR operation. If the operand corresponding with the gate voltage is a logic "1," then a gate voltage 742 of 5.5V will be applied to the memory cell transistor during the logic XOR operation.

If the two operands are both logic "0," then the gate voltage 744 applied to the first memory cell transistor will be less than the threshold voltage 746 for the first memory cell transistor causing the first memory cell transistor to be set into a non-conducting state and an output data value of logic "0" to be output by the programmable sense amplifier because the memory cell current is less than the first current threshold 743 of 1 uA. If the two operands are both logic "1," then the gate voltage 742 applied to the first memory cell transistor will be greater than the threshold voltage 748 for the first memory cell transistor causing the first memory cell transistor to be set into a conducting state and conduct a memory cell current 745 of 10 uA and the output data value of logic "0" to be output by the programmable sense amplifier because the memory cell current is greater than the second current threshold 741 of 5 uA. If the operand corresponding with the gate voltage is a logic "0" and the operand corresponding with the threshold voltage is a logic "1," then the gate voltage 744 applied to the first memory cell transistor will be greater than the threshold voltage 748 for the first memory cell transistor causing the first memory cell transistor to be set into a conducting state and the output data value of logic "1" to be output because the memory cell current 747 is less than the second current threshold 741 of 5 uA and greater than the first current threshold 743 of 1 uA. If the operand corresponding with the gate voltage is a logic "1" and the operand corresponding with the threshold voltage is a logic "0," then the gate voltage 742 applied to the first memory cell transistor will be greater than the threshold voltage 746 for the first memory cell transistor causing the first memory cell transistor to be set into a conducting state and the output data value of logic "1" to be output because the memory cell current 749 is less than the second current threshold 741 of 5 uA and greater than the first current threshold 743 of 1 uA. Therefore, the programmable double threshold sense amplifier outputs a logic "1" value if the memory cell current is between the first current threshold 743 of 1 uA and the second current threshold 741 of 5 uA; otherwise, the programmable double threshold sense amplifier outputs a logic "0" value.

Figures 7G, 7H:
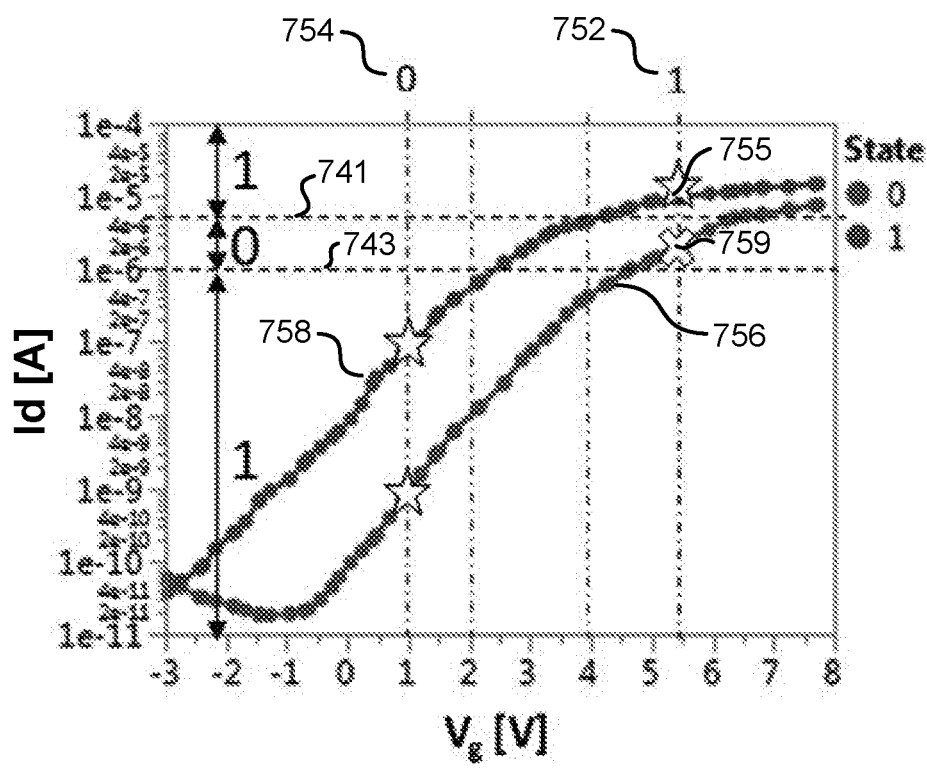
FIG. 7G depicts one embodiment of a truth table for an IMP function.
FIG. 7H depicts one embodiment of the threshold voltage and the gate voltage settings for performing a logic IMP (or material implication) operation using a memory cell transistor.

FIG. 7G depicts one embodiment of a truth table for an IMP function. FIG. 7H depicts one embodiment of the threshold voltage and the gate voltage settings for performing a logic IMP (or material implication) operation using a memory cell transistor. The IMP operation may be performed using a memory cell transistor coupled to a programmable double threshold sense amplifier, such as the programmable sense amplifier 606 depicted in FIG. 6A. As depicted in FIG. 7H, if the operand corresponding with the threshold voltage is a logic "0," then the memory cell transistor is programmed to the threshold voltage 756 that causes the memory cell transistor to output 1 uA of memory cell current with a gate voltage of 4.7V; however, if the operand corresponding with the threshold voltage is a logic "1," then the memory cell transistor is programmed to the threshold voltage 758 that causes the memory cell current to output 1 uA of memory cell current with a gate voltage of 2.5V. If the operand corresponding with the gate voltage is a logic "0," then a gate voltage 754 of 1V will be applied to the memory cell transistor during the logic IMP operation. If the operand corresponding with the gate voltage is a logic "1," then a gate voltage 752 of 5.5V will be applied to the memory cell transistor during the logic IMP operation.

If the two operands are both logic "0," then the gate voltage 754 applied to the first memory cell transistor will be less than the threshold voltage 756 for the first memory cell transistor causing the first memory cell transistor to be set into a non-conducting state and an output data value of logic "0" to be output by the programmable sense amplifier because the memory cell current is less than the first current threshold 743 of 1 uA. If the two operands are both logic "1," then the gate voltage 752 applied to the first memory cell transistor will be greater than the threshold voltage 758 for the first memory cell transistor causing the first memory cell transistor to be set into a conducting state and conduct a memory cell current 755 of 10 uA and the output data value of logic "1" to be output by the programmable sense amplifier because the memory cell current 755 is greater than the second current threshold 741 of 5 uA. If the operand corresponding with the gate voltage is a logic "0" and the operand corresponding with the threshold voltage is a logic "1," then the gate voltage 754 applied to the first memory cell transistor will be less than the threshold voltage 758 for the first memory cell transistor causing the first memory cell transistor to be set into a non-conducting state and the output data value of logic "1" to be output because the memory cell current is less than the first current threshold 743 of 1 uA. If the operand corresponding with the gate voltage is a logic "1" and the operand corresponding with the threshold voltage is a logic "0," then the gate voltage 752 applied to the first memory cell transistor will be greater than the threshold voltage 756 for the first memory cell transistor causing the first memory cell transistor to be set into a conducting state and the output data value of logic "0" to be output because the memory cell current 759 is less than the second current threshold 741 of 5 uA and greater than the first current threshold 743 of 1 uA. Therefore, the programmable double threshold sense amplifier outputs a logic "0" value if the memory cell current is between the first current threshold 743 of 1 uA and the second current threshold 741 of 5 uA; otherwise, the programmable double threshold sense amplifier outputs a logic "1" value.

Figure 8A:
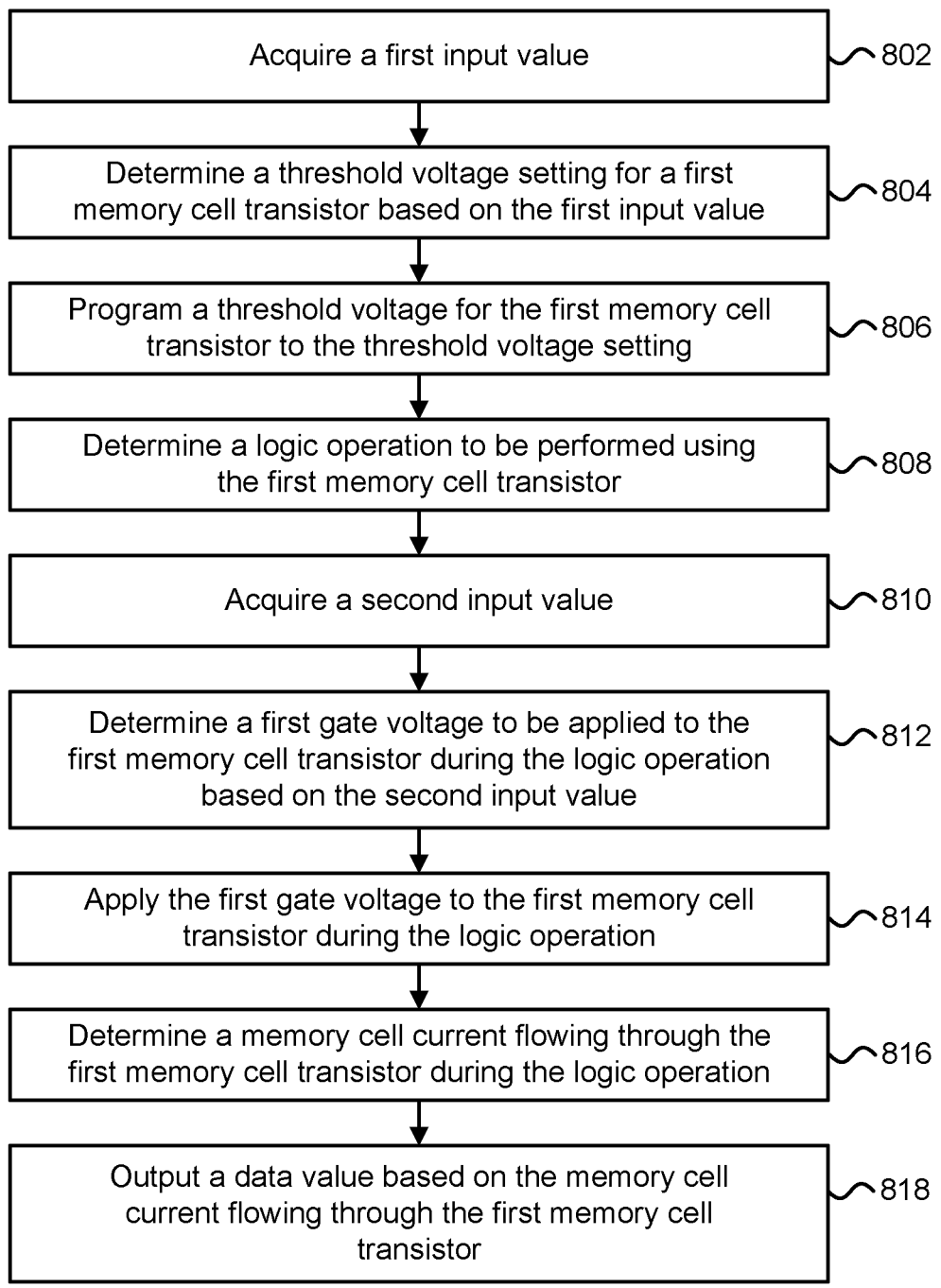
FIG. 8A is a flowchart describing one embodiment of a process for performing a logic operation using a memory cell transistor.

FIG. 8A is a flowchart describing one embodiment of a process for performing a logic operation using a memory cell transistor. In one embodiment, the process of FIG. 8A may be performed by control circuitry, such as logic control 311 depicted in FIG. 2, and/or a memory cell transistor, such as memory cell transistor 602 in FIG. 6A.

In step 802, a first input value is acquired. The first input value may correspond with a first operand associated with a logic operation. In step 804, a threshold voltage setting for a first memory cell transistor is determined based on the first input value. In one example, if the first input value corresponds with a logic "0," then the threshold voltage setting may be set to 3V; however, if the first input value corresponds with a logic "1," then the threshold voltage setting may be set to 1V. The threshold voltage settings for the first memory cell transistor may be stored in a lookup table that is accessible by control circuitry for setting or programming the threshold voltage for the first memory cell transistor prior to performing the logic operation. In step 806, a threshold voltage for the first memory cell transistor is programmed to the threshold voltage setting. In step 808, a logic operation to be performed using the first memory cell transistor is determined. The logic operation may comprise a Boolean logic operation, such as an AND or XOR operation.

In step 810, a second input value is acquired. The second input value may correspond with a second operand associated with the logic operation. In step 812, a first gate voltage to be applied to the first memory cell transistor during the logic operation is determined based on the second input value. In this case, the second input value may set the gate voltage applied to the first memory cell transistor and the first input value may set the threshold voltage for the first memory cell transistor. In step 814, the first gate voltage is applied to the first memory cell transistor during the logic operation. In step 816, a memory cell current flowing through the first memory cell transistor is sensed or determined during the logic operation. In step 818, a data value is outputted based on the memory cell current flowing through the first memory cell transistor. In one example, the data value may be determined and outputted using a programmable double threshold sense amplifier, such as the programmable sense amplifier 606 depicted in FIG. 6A.

Figure 8B:
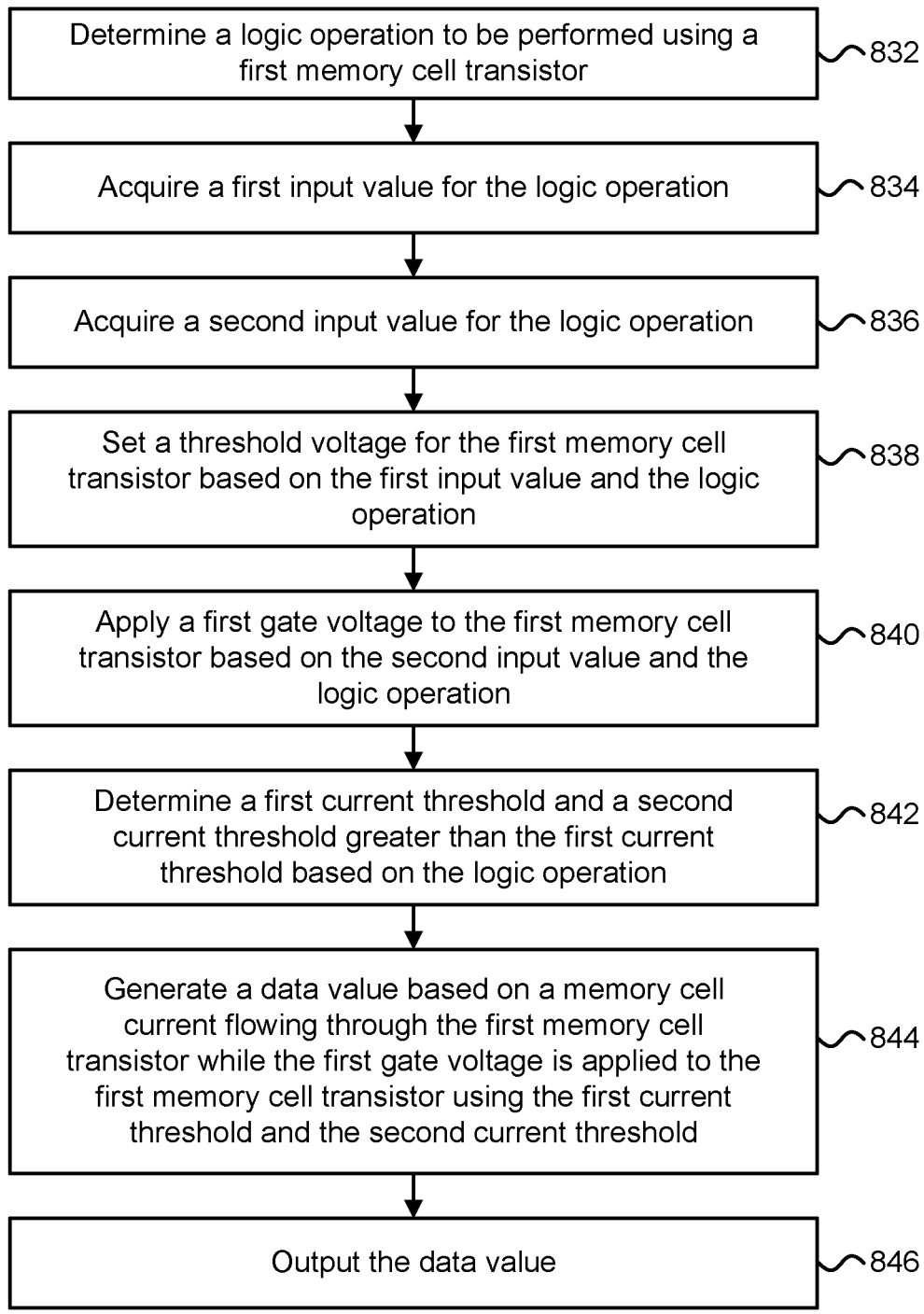
FIG. 8B is a flowchart describing another embodiment of a process for performing a logic operation using a memory cell transistor.

FIG. 8B is a flowchart describing another embodiment of a process for performing a logic operation using a memory cell transistor. In one embodiment, the process of FIG. 8B may be performed by control circuitry, such as logic control 311 depicted in FIG. 2, and/or a memory cell transistor, such as memory cell transistor 602 in FIG. 6A.

In step 832, a logic operation to be performed using a first memory cell transistor is determined. The first memory cell transistor may correspond with memory cell transistor 602 in FIG. 6A. The first memory cell transistor may correspond with a memory cell transistor within a memory array or memory structure, such as the memory structure 326 depicted in FIG. 2. The logic operation may comprise a Boolean logic operation, such as an OR operation or an IMP operation. In step 834, a first input value for the logic operation is acquired. In step 836, a second input value for the logic operation is acquired. The first input value may correspond with a first operand and the second input value may correspond with a second operand for the logic operation. In step 838, a threshold voltage for the first memory cell transistor is set based on the first input value and the logic operation. In one example, if the first input value comprises a logic "0," then the threshold voltage may be set to a first threshold voltage setting (e.g., 4V); however, if the first input value comprises a logic "1," then the threshold voltage may be set to a second threshold voltage setting less than the first threshold voltage setting.

In step 840, a first gate voltage is applied to the first memory cell transistor based on the second input value and the logic operation. In one example, if the second input value comprises a logic "0," then the first gate voltage may be set to a first gate voltage setting; however, if the second input value comprises a logic "1," then the first gate voltage may be set to a second gate voltage setting that is less than the first gate voltage setting. In one embodiment, the first gate voltage may correspond with gate voltage 742 in FIG. 7E and the first threshold voltage setting may correspond with threshold voltage 748 in FIG. 7E. In step 842, a first current threshold and a second current threshold greater than the first current threshold are determined based on the logic operation. In one example, if the logic operation comprises an XOR operation, then the first current threshold may be set to 1 uA and the second current threshold may be set to 5 uA. In step 844, a data value is generated based on a memory cell current flowing through the first memory cell transistor while the first gate voltage is applied to the first memory cell transistor. The data value may be determined based on the memory cell current flowing through the first memory cell transistor, the first current threshold, and the second current threshold. In step 846, the data value is outputted. The data value may be outputted by transferring the data value to a CPU or storing the data value in a memory. The data value may be generated and outputted using a programmable sense amplifier, such as the programmable sense amplifier 606 in FIG. 6A. In one embodiment, if the logic operation comprises an IMP operation, then the gate voltage and the threshold voltage applied to the first memory cell transistor during the logic operation may correspond with the gate voltages and threshold voltages depicted in FIG. 7F. The programmable sense amplifier may output a logic "0" if the memory cell current flowing through the first memory cell transistor is between the first current threshold and the second current threshold; otherwise, the programmable sense amplifier may output a logic "1."

Figure 8C:
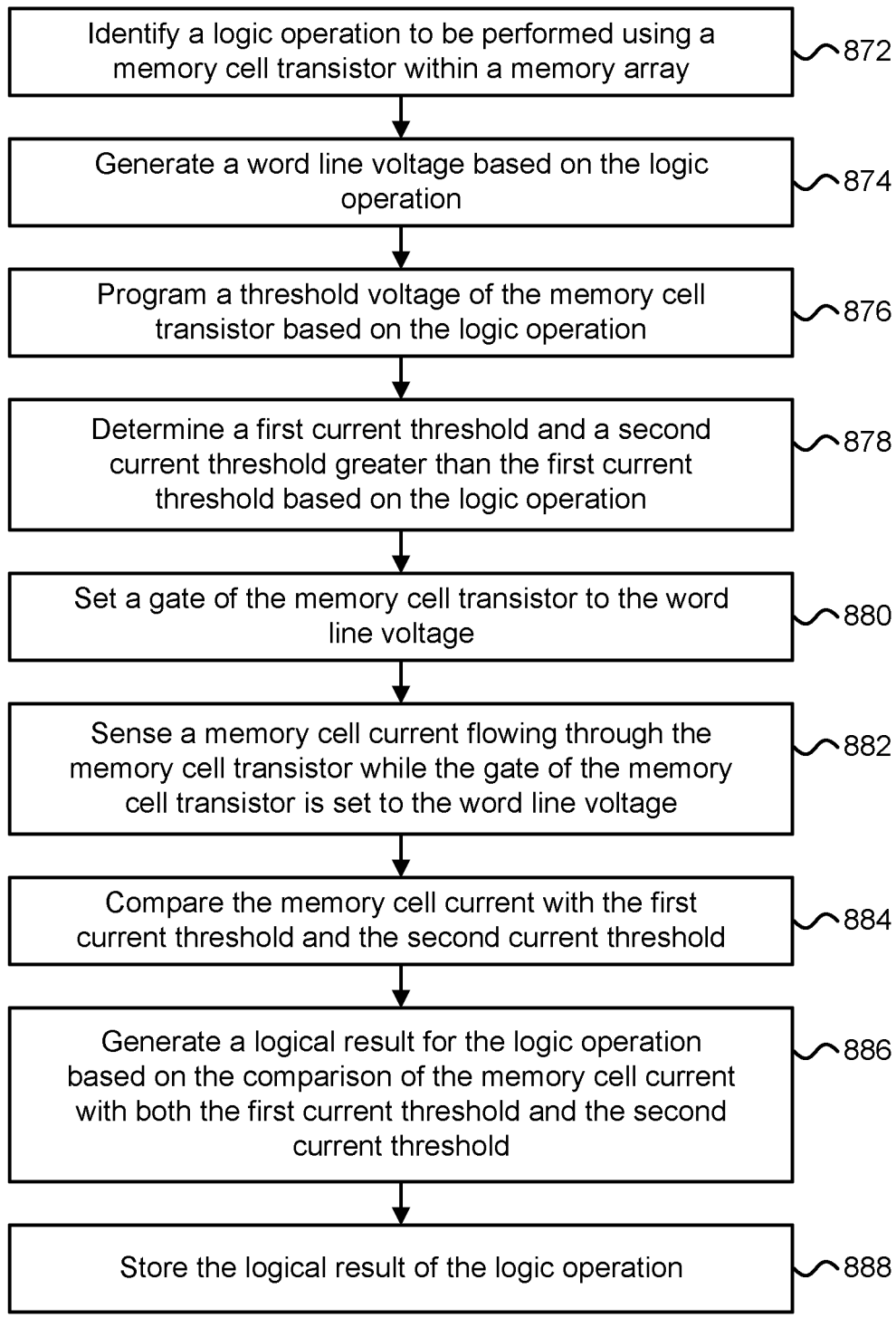
FIG. 8C is a flowchart describing another embodiment of a process for performing a logic operation using a memory cell transistor.

FIG. 8C is a flowchart describing another embodiment of a process for performing a logic operation using a memory cell transistor. In one embodiment, the process of FIG. 8C may be performed by control circuitry, such as logic control 311 depicted in FIG. 2, and/or a memory cell transistor, such as memory cell transistor 602 in FIG. 6A.

In step 872, a logic operation to be performed using a memory cell transistor within a memory array is performed. The logic operation may comprise an AND, OR, XOR, or IMP operation. The memory cell transistor may correspond with memory cell transistor 602 in FIG. 6A. The gate of the memory cell transistor may be connected to a word line within the memory array. The memory array may comprise a 2D memory array or a 3D memory array. The memory array may comprise a set of vertical NAND strings. In step 874, a word line voltage is generated based on the logic operation. The word line voltage may be generated by accessing a lookup table that stores the appropriate word line voltage for a given logic operation and generating the appropriate word line voltage using a voltage generator. In step 876, a threshold voltage of the memory cell transistor is programmed based on the logic operation. In step 878, a first current threshold and a second current threshold greater than the first current threshold is determined based on the logic operation. The first current threshold and the second current threshold may be determined via a lookup table that specifies the pair of current thresholds for a given logic operation. In one example, if the logic operation comprises an XOR operation, then the first current threshold may comprise 1 uA and the second current threshold may comprise 10 uA.

In step 880, a gate of the memory cell transistor is set to the word line voltage. In step 882, a memory cell current flowing through the memory cell transistor is sensed while the gate of the memory cell transistor is set to the word line voltage. In step 884, the memory cell current is compared with the first current threshold and the second current threshold. In one example, the programmable sense amplifier depicted in FIG. 6B may be used to perform the comparisons of the memory cell current with both the first current threshold and the second current threshold. In step 886, a logical result of the logic operation is generated based on the comparison of the memory cell current with both the first current threshold and the second current threshold. In step 888, the logical result of the logic operation is stored. The logical result may be stored as a data value within a volatile or non-volatile memory.

One embodiment of the disclosed technology includes a control circuit, a memory cell transistor, and a programmable sense amplifier in communication with the memory cell transistor and the control circuit. The control circuit configured to acquire a first operand and a second operand for a logic operation. The control circuit configured to program a threshold voltage of the memory cell transistor based on the first operand and apply a gate voltage to a gate of the memory cell transistor based on the second operand. The programmable sense amplifier configured to generate a data value for the logic operation based on a memory cell current of the memory cell transistor while the gate voltage is applied to the gate of the memory cell transistor.

One embodiment of the disclosed technology includes determining a logic operation to be performed using a memory cell transistor and a programmable sense amplifier, acquiring a first operand for the logic operation, acquiring a second operand for the logic operation, setting a threshold voltage of the memory cell transistor based on the first operand, applying a gate voltage to a gate of the memory cell transistor based on the second operand, determining a first current threshold based on the logic operation, generating a data value based on a comparison of the first current threshold with a memory cell current flowing through the memory cell transistor while the gate voltage is applied to the gate of the memory cell transistor, and outputting or transferring the data value.

One embodiment of the disclosed technology includes a NAND string including a memory cell transistor, one or more control circuits, and a programmable sense amplifier in communication with the NAND string and the one or more control circuits. The one or more control circuits configured to acquire a first operand and a second operand associated with a logic operation. The one or more control circuits configured to set a threshold voltage of the memory cell transistor based on the first operand and bias a gate of the memory cell transistor to a gate voltage based on the second operand. The programmable sense amplifier configured to acquire a first current threshold and a second current threshold based on the logic operation. The programmable sense amplifier configured to generate a data value for the logic operation via comparison of a memory cell current of the memory cell transistor while the gate voltage is applied to the gate of the memory cell transistor with the first current threshold and the second current threshold.

One embodiment of the disclosed technology includes identifying a logic operation to be performed using a memory cell transistor, setting a threshold voltage of the memory cell transistor based on the logic operation, determining a first current threshold and a second current threshold greater than the first current threshold based on the logic operation, generating a word line voltage based on the logic operation, setting a gate of the memory cell transistor to the word line voltage, sensing a memory cell current flowing through the memory cell transistor while the gate of the memory cell transistor is set to the word line voltage, generating a data value based on a comparison of the memory cell current flowing through the memory cell transistor with both the first current threshold and the second current threshold, and storing the data value.

For purposes of this document, a first layer may be over or above a second layer if zero, one, or more intervening layers are between the first layer and the second layer.

For purposes of this document, it should be noted that the dimensions of the various features depicted in the figures may not necessarily be drawn to scale.

For purposes of this document, reference in the specification to "an embodiment," "one embodiment," "some embodiments," or "another embodiment" may be used to describe different embodiments and do not necessarily refer to the same embodiment.

For purposes of this document, a connection may be a direct connection or an indirect connection (e.g., via another part). In some cases, when an element is referred to as being connected or coupled to another element, the element may be directly connected to the other element or indirectly connected to the other element via intervening elements. When an element is referred to as being directly connected to another element, then there are no intervening elements between the element and the other element.

Two devices may be "in communication" if they are directly or indirectly connected so that they can communicate electronic signals between them.

For purposes of this document, the term "based on" may be read as "based at least in part on."

For purposes of this document, without additional context, use of numerical terms such as a "first" object, a "second" object, and a "third" object may not imply an ordering of objects, but may instead be used for identification purposes to identify different objects.

For purposes of this document, the term "set" of objects may refer to a "set" of one or more of the objects.

Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims.

What is claimed is:

1. An apparatus, comprising:
a control circuit;
a memory cell transistor; and
a programmable sense amplifier in communication with the memory cell transistor and the control circuit, the control circuit configured to acquire a first operand and a second operand for a logic operation, the control circuit configured to program a threshold voltage of the memory cell transistor based on the first operand and apply a gate voltage to a gate of the memory cell transistor based on the second operand, the programmable sense amplifier configured to generate a data value for the logic operation based on a memory cell current of the memory cell transistor while the gate voltage is applied to the gate of the memory cell transistor.

2. The apparatus of claim 1, wherein:
the programmable sense amplifier configured to determine a first current threshold and generate the data value based on a comparison of the memory cell current flowing through the memory cell transistor and the first current threshold.

3. The apparatus of claim 2, wherein:
the programmable sense amplifier configured to determine a second current threshold greater than the first current threshold and generate the data value based on a comparison of the memory cell current with the first current threshold and the second current threshold.

4. The apparatus of claim 3, wherein:
the programmable sense amplifier configured to output a first data value if the memory cell current is between the first current threshold and the second current threshold and output a second data value if the memory cell current is greater than both the first current threshold and the second current threshold or less than both the first current threshold and the second current threshold.

5. The apparatus of claim 3, wherein:
the programmable sense amplifier configured to concurrently compare the memory cell current with the first current threshold and the second current threshold.

6. The apparatus of claim 1, wherein:
the memory cell transistor is part of a NAND string.

7. The apparatus of claim 1, wherein:
the logic operation comprises an XOR operation.

8. The apparatus of claim 1, wherein:
the memory cell transistor comprises a charge trap transistor.

9. The apparatus of claim 1, wherein:
the control circuit configured to program the threshold voltage of the memory cell transistor based on user data subsequent to the data value being generated by the programmable sense amplifier.

10. The apparatus of claim 1, wherein:
the control circuit configured to prefetch the first operand and set the threshold voltage of the memory cell transistor based on the first operand prior to acquisition of the second operand.

11. A method, comprising:
identifying a logic operation to be performed using a memory cell transistor;
generating a word line voltage based on the logic operation;
setting a threshold voltage of the memory cell transistor based on the logic operation;
determining a first current threshold and a second current threshold greater than the first current threshold based on the logic operation;
setting a gate of the memory cell transistor to the word line voltage;
sensing a memory cell current flowing through the memory cell transistor while the gate of the memory cell transistor is set to the word line voltage, the sensing the memory cell current is performed subsequent to setting the threshold voltage of the memory cell transistor;
generating a logical result based on a comparison of the memory cell current flowing through the memory cell transistor with both the first current threshold and the second current threshold; and
storing the logical result.

12. The method of claim 11, further comprising:
the generating the logical result comprises generating a data value using a programmable sense amplifier; and
the memory cell current is greater than the first current threshold and less than the second current threshold.

13. The method of claim 12, wherein:
the generating the data value includes concurrently comparing the memory cell current with the first current threshold and the second current threshold.

14. The method of claim 11, wherein:
the memory cell transistor is part of a vertical NAND string.

15. The method of claim 11, wherein:
the logic operation comprises an implication operation.

16. The method of claim 11, further comprising:
acquiring a first operand for the logic operation prior to setting the threshold voltage of the memory cell transistor; and
programming the threshold voltage of the memory cell transistor to a threshold voltage setting associated with the first operand prior to applying the gate voltage to the gate of the memory cell transistor.

17. The method of claim 11, wherein:
the memory cell transistor comprises a floating gate transistor.

18. The method of claim 11, further comprising:
storing user data using the memory cell transistor subsequent to storing the logical result.

19. The method of claim 11, further comprising:
prefetching a first operand for the logic operation prior to setting the threshold voltage of the memory cell transistor; and
setting the threshold voltage of the first memory cell transistor based on the first operand.

20. An apparatus, comprising:
a NAND string including a memory cell transistor;
one or more control circuits; and
a programmable sense amplifier in communication with the NAND string and the one or more control circuits, the one or more control circuits configured to acquire a first operand and a second operand associated with a logic operation, the one or more control circuits configured to set a threshold voltage of the memory cell transistor based on the first operand and bias a gate of the memory cell transistor to a gate voltage based on the second operand, the programmable sense amplifier configured to acquire a first current threshold and a second current threshold based on the logic operation, the programmable sense amplifier configured to generate a data value for the logic operation via comparison of the first current threshold and the second current threshold with a memory cell current of the memory cell transistor while the gate of the memory cell transistor is biased to the gate voltage.

* * * * *